(12) United States Patent
McNutt et al.

(10) Patent No.: US 7,982,239 B2
(45) Date of Patent: Jul. 19, 2011

(54) POWER SWITCHING TRANSISTORS

(75) Inventors: Ty R. McNutt, Columbia, MD (US); Eric J. Stewart, Silver Spring, MD (US); Rowland C. Clarke, Sykesville, MD (US); Ranbir Singh, South Riding, VA (US); Stephen Van Campen, Clarksville, MD (US); Marc E. Sherwin, Catonsville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 566 days.

(21) Appl. No.: 11/808,915

(22) Filed: Jun. 13, 2007

(65) Prior Publication Data
US 2008/0308838 A1  Dec. 18, 2008

(51) Int. Cl.
*H01L 29/47* (2006.01)

(52) U.S. Cl. ........ 257/133; 257/109; 257/471; 257/475; 257/E21.351

(58) Field of Classification Search .................. 257/133, 257/109, 155, 471, 475, E21.351; 438/92, 438/167, 570
See application file for complete search history.

(56) References Cited

U.S. PATENT DOCUMENTS

| 5,807,773 | A | 9/1998 | Chen et al. |
| 5,903,020 | A | 5/1999 | Siergiej et al. |
| 5,945,701 | A | 8/1999 | Siergiej et al. |
| 7,098,488 | B2 | 8/2006 | Yoshikawa et al. |

OTHER PUBLICATIONS

Rupp, Roland, et al., 2nd Generation SiC Schottky diodes: A new benchmark in SiC device ruggedness, Jun. 4-8, 2006, Proceedings of the 18th International Symposium on Power Semiconductor Devices & IC's, pp. 1-4.

*Primary Examiner* — Cuong Q Nguyen
*Assistant Examiner* — Cathy N Lam
(74) *Attorney, Agent, or Firm* — Andrews Kurth LLP

(57) ABSTRACT

In an embodiment, a integrated semiconductor device includes a first Vertical Junction Field Effect Transistor (VJFET) having a source, and a gate disposed on each side of the first VJFET source, and a second VJFET transistor having a source, and a gate disposed on each side of the second VJFET source. At least one gate of the first VJFET is separated from at least one gate of the second VJFET by a channel. The integrated semiconductor device also includes a Junction Barrier Schottky (JBS) diode positioned between the first and second VJFETs. The JBS diode comprises a metal contact that forms a rectifying contact to the channel and a non-rectifying contact to at least one gate of the first and second VJFETs, and the metal contact is an anode of the JBS diode. A first electrical connection ties the gates of the first VJFET, the gates of the second VJFET, and the anode of the JBS diode to a common gate electrode and a second electrical connection ties the source of the first VJFET and the source of the second VJFET to a common source electrode.

10 Claims, 20 Drawing Sheets

POWER SWITCHING TRANSISTORS

FIELD OF THE INVENTION

The invention relates generally to electronic devices, specifically to improved power switching transistors.

BACKGROUND OF THE INVENTION

Transistors have many applications. For example, transistors can be used as a switch or can be used to amplify an input current. As a switch, a transistor may be either fully "on" with maximum current flow, or fully "off" with minimal, ideally zero, current. As an amplifier, a transistor can amplify the small output current from a logic chip so that it can operate a larger device such as a relay or other high current device. Transistors are incorporated into most electrical circuits.

Designers strive to make continuous improvements to make transistors smaller and exhibit improved performance.

SUMMARY OF THE INVENTION

An integrated semiconductor device includes a first Vertical Junction Field Effect Transistor (VJFET) having a source, and a gate disposed on each side of the first VJFET source, and a second VJFET transistor having a source, and a gate disposed on each side of the second VJFET source. At least one gate of the first VJFET is separated from at least one gate of the second VJFET by a channel. The integrated semiconductor device also includes a Junction Barrier Schottky (JBS) diode positioned between the first and second VJFETs. The JBS diode comprises a metal contact that forms a rectifying contact to the channel and a non-rectifying contact to at least one gate of the first and second VJFETs, and the metal contact is an anode of the JBS diode. A first electrical connection ties the gates of the first VJFET, the gates of the second VJFET, and the anode of the JBS diode to a common gate electrode and a second electrical connection ties the source of the first VJFET and the source of the second VJFET to a common source electrode.

DETAILED DESCRIPTION

Figure 1:
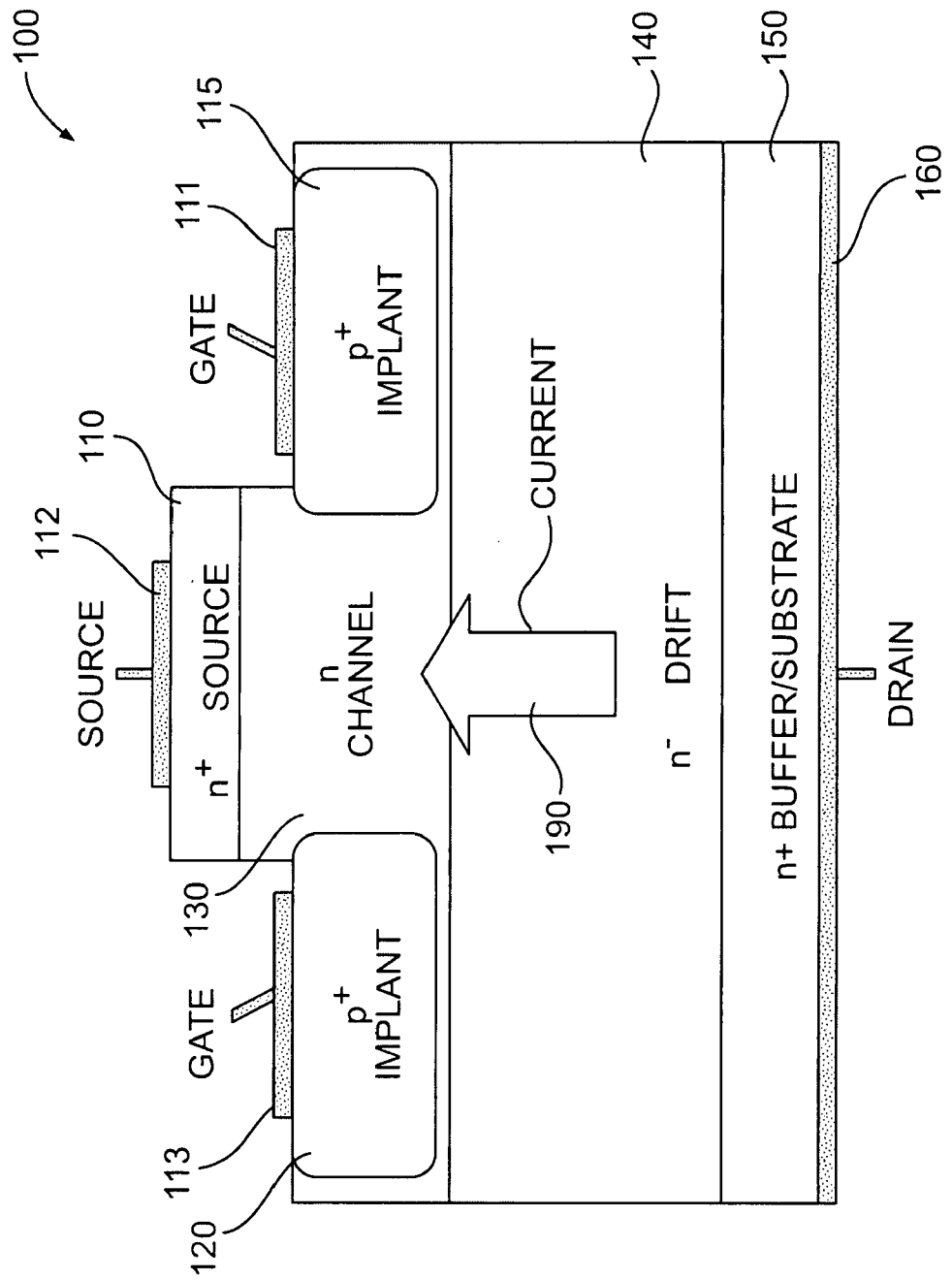
FIG. 1 illustrates a vertical junction field-effect transistor (VJFET) that may be used as power switching transistor.

FIG. 1 illustrates a recessed-gate vertical junction field-effect transistor (VJFET) 100 that may be used as power switching transistor. VJFETs may be used for wide-bandgap materials (such as silicon carbide (SiC)) that do not have a high-quality native oxide for MOS devices. The VJFET 100 includes a source 112 and a N+ source region 110. A channel 130 is disposed under the source as shown. The channel 130 separates a first gate 113 and an P+ implant 120, from a second gate 111 and P+ implant 115. The gates 111 and 113 are formed from metal that makes ohmic (non-rectifying) contact to the p+ semiconductor, and are electrically connected (not shown) such that they form two parts of the same gate electrode. The channel 130 and drift region 140 are disposed on a semiconductor N+ buffer/substrate, such as a silicon carbide. The substrate is coupled to a drain 160.

As shown by the arrow, current 190 flows from the drain 160 to the source 112, in between the two implanted P+ gate regions 115 and 120. A thick, lightly-doped "drift" region 140 separates the high-voltage drain 160 of the device 100 with the low-voltage gates 113, 111 and source 112. The spacing between the P+ gate regions 115 and 120, and the voltage applied to them, control the amount of current 190 that flows. If the P+ regions 115 and 120 are spaced far apart, the device 100 is "normally-on" and current 190 flows through the channel 130 at $V_{GS}$ (i.e., voltage gate to source)=0 V. To turn the device 100 off, a negative $V_{GS}$ must be applied, causing the depletion regions from the reverse-biased p/n junctions to pinch-off the channel 130. Alternatively, if the P+ regions 115 and 120 are close together, the built-in depletion regions will pinch-off the channel 130 with no applied bias ($V_{GS}$=0 V). In this case, the device 100 is "normally-off," and a positive voltage must be applied to the gate to turn the device "on." Although only one source and two gates are shown in FIG. 1, a power VJFET may contain hundreds (or thousands) of transistors repeating this structure, all connected in parallel to obtain high currents.

For power switching applications, a VJFET may be used in a cascode configuration, in which a low-voltage normally-off (Noff) device is connected in series with a high-voltage "normally-on" (Non) device. The cascode configuration can be implemented either with two discrete devices or monolithically on a single chip. The gate of the Non device is connected to the source of the Noff device. In the off-state, the Noff initially blocks the voltage. This reverse-biases the gate-source junction of the Non device, which at some low voltage (e.g., $V_{GS}=-20\,V$) turns off. The Non VJFET then blocks the bulk of the high voltage (e.g., 300V-10 kV). The cascode configuration has several advantages compared to a single device, including (i) faster switching speed, due to the reduced Miller capacitance; (ii) elimination of the need for a high-voltage Noff VJFETs, which can be very resistive; and (iii) an integral anti-parallel diode.

Figure 2:
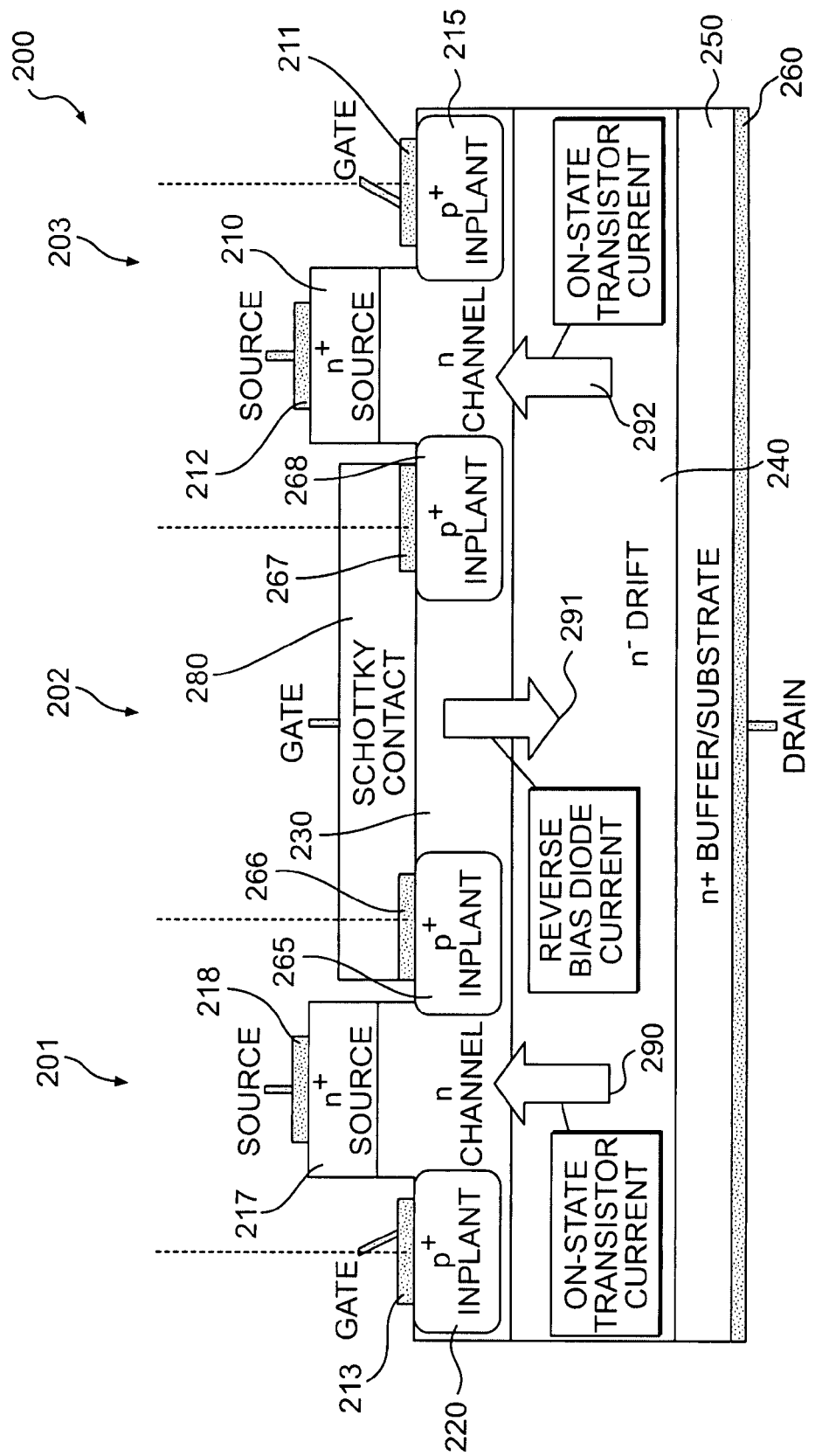
FIG. 2 illustrates an integrated VJFET/JBSD device, in accordance with an embodiment.

FIG. 2 illustrates an integrated VJFET/JBSD (Junction Barrier Schottky Diode) power switch 200, in accordance with an embodiment. FIG. 2 includes two VJFETs 201 and 203, configured as shown. The first VJFET 201 includes a source 218 and a N+ source region 217. A channel 230 is disposed under the source 217, as shown. The channel 230 separates a first gate 213 and an P+ implant 220, from a second gate 266 and P+ implant 265. The channel 230 is disposed on a substrate, such as a silicon carbide. The substrate includes a N– drift region 240 and a N+ buffer/substrate 250. The substrate is coupled to a drain 260. The second VJFET 203 includes a source 212 and a N+ source region 210. A channel 230 is disposed under the source as shown. The channel 230 separates a first gate 211 and an P+ implant 215, from a second gate 267 and P+ implant 268. The gate contacts 211, 213, 266, and 267 are all formed from metal that makes ohmic contact to the semiconductor. As can be seen, the channel 230, disposed on the substrate, is common to the first VJFET 201 and the second VJFET 203. The second VJFET 203 also shares a common N– drift region 240, N+ buffer/substrate 250, and drain 260 with the first VJFET 201.

The integrated VJFET/JBSD device 200 includes a pair of gates, such as gate 266 and gate 267, and a channel 230 disposed between the gates, that are contacted by the Schottky metal 280. The Schottky metal 280 makes a Schottky (rectifying) contact to the semiconductor channel 230 and ohmic (non-rectifying) contact to the gates 266 and 267, and forms the anode for the integral JBSD contained in the device. The JBSD 202 is formed on a substrate that includes the N-drift layer 240, N+ buffer/substrate 250 and drain 260.

The gates 213, 280 and 211 of the integrated VJFET/JBSD device 200 are tied together to form a single gate for the device. The source 212 and 218 are tied together to form a single source for the device 200.

The integrated VJFET/JBSD device 200, shown in FIG. 2, functions as a "normally-on" VJFET with an integral JBSD.

As shown by the arrows, for example, in the "on" state ($V_{GS}=0\,V$, $V_{DS}>0\,V$) transistor current 290 and 292 flows from the drain 260 to the source 217 and 210, respectively, in between the two implanted P+ gate regions. If the device is switched to the "off" state ($V_{GS}$ is negative enough to pinch-off the channel 230), the VJFET transistor current 290 and 292 is turned off. If, while the device is in the "off" state, a positive bias is applied gate to drain ($V_{GD}>0\,V$) that is greater than the turn-on voltage of the JBSD, diode current flows in the opposite direction, as shown by arrow 291. The thick, lightly-doped "drift" region 240 separates the high-voltage drain 260 of the device 200 from the source 210 and 217 (which are tied together). The spacing between the P+ gate regions 220 and 265, and 268 and 215, is made large enough to ensure that the device 200 is "normally-on" and that current 290, 292 flows through the channel 230 at $V_{GS}=0\,V$. To turn the device 200 off, a negative $V_{GS}$ is applied, causing depletion regions from the reverse-biased p/n junctions to pinch-off the channel 230, between gate regions 220 and 265, and 268 and 215. Although only one set of sources and gates is shown here, a integrated VJFET/JBSD device 200 may be configured to contain hundreds or thousands of repeating source/gate fingers to obtain high currents.

Figure 3A:
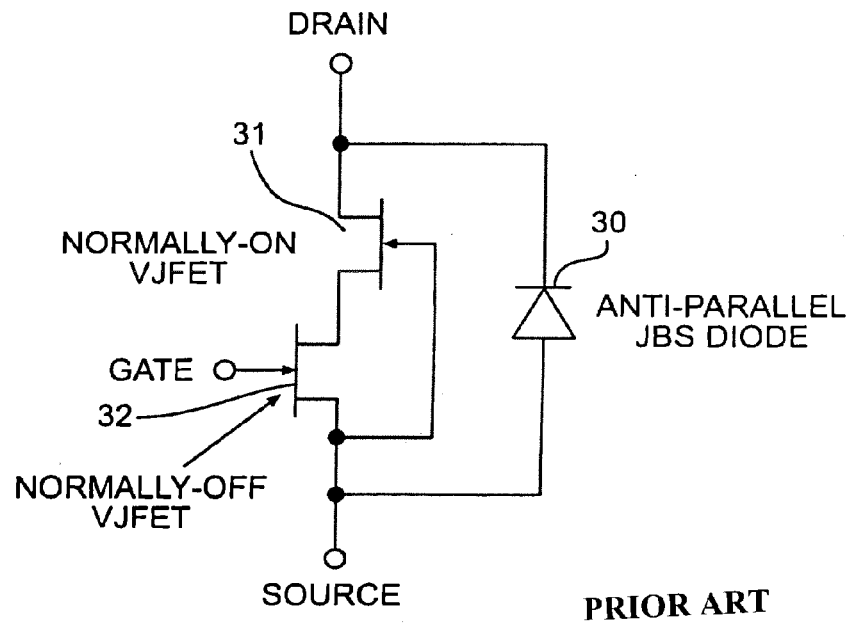
FIG. 3 shows a power conditioning circuit using a conventional VJFET switch (3A), and a power conditioning circuit using an integrated VJFET/JBSD device (3B), in accordance with an embodiment.

For power conditioning circuits, it is often desirable to connect a JBS diode in anti-parallel configuration with the power switch, as shown in FIG. 3A. This is often done using separate discrete devices for the transistor and diode. If a conventional VJFET cascode switch is used as the power switch, three separate devices are needed: normally-off VJFET 32, normally-on VJFET 31, and JBS diode 30.

Figure 3B:
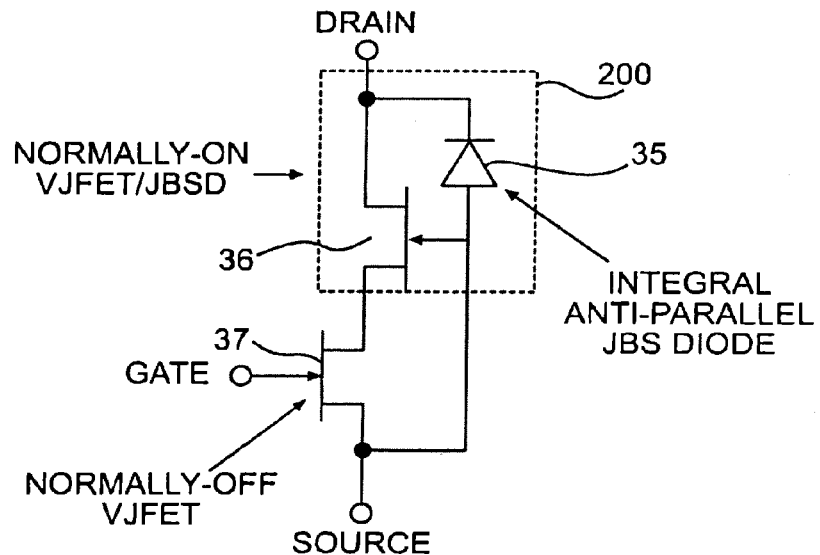

In accordance with an embodiment, a normally-on integrated VJFET/JBSD device 200, when connected in cascode configuration with a standard normally-off VJFET transistor 37, has an "anti-parallel" JBS diode 35 automatically integrated with a normally-on VJFET 36 within the device, as shown in FIG. 3B. As a result, two devices, such as a normally-on integrated VJFET/JBSD device 200 and a standard normally-off VJFET transistor 37, can be used in place of three, reducing the cost and complexity, while increasing the reliability of the power conditioning circuit.

In one example, the doping concentration may be around $5\times10^{15}/cm^3$ in the n-drift layer, while the n-channel layer may have a doping concentration of about $3\times10^{16}/cm^3$. The Schottky gate, ohmic contact and source regions may have a doping concentration of $1\times10^{19}/cm^3$, and the P+ implant regions may have a doping concentrations ranging from $1\times10^{16}/cm^3$ to $1\times10^{18}/cm^3$. This doping levels are given as an example. The doping levels for devices and device regions can be varied as desirable.

Figure 4:
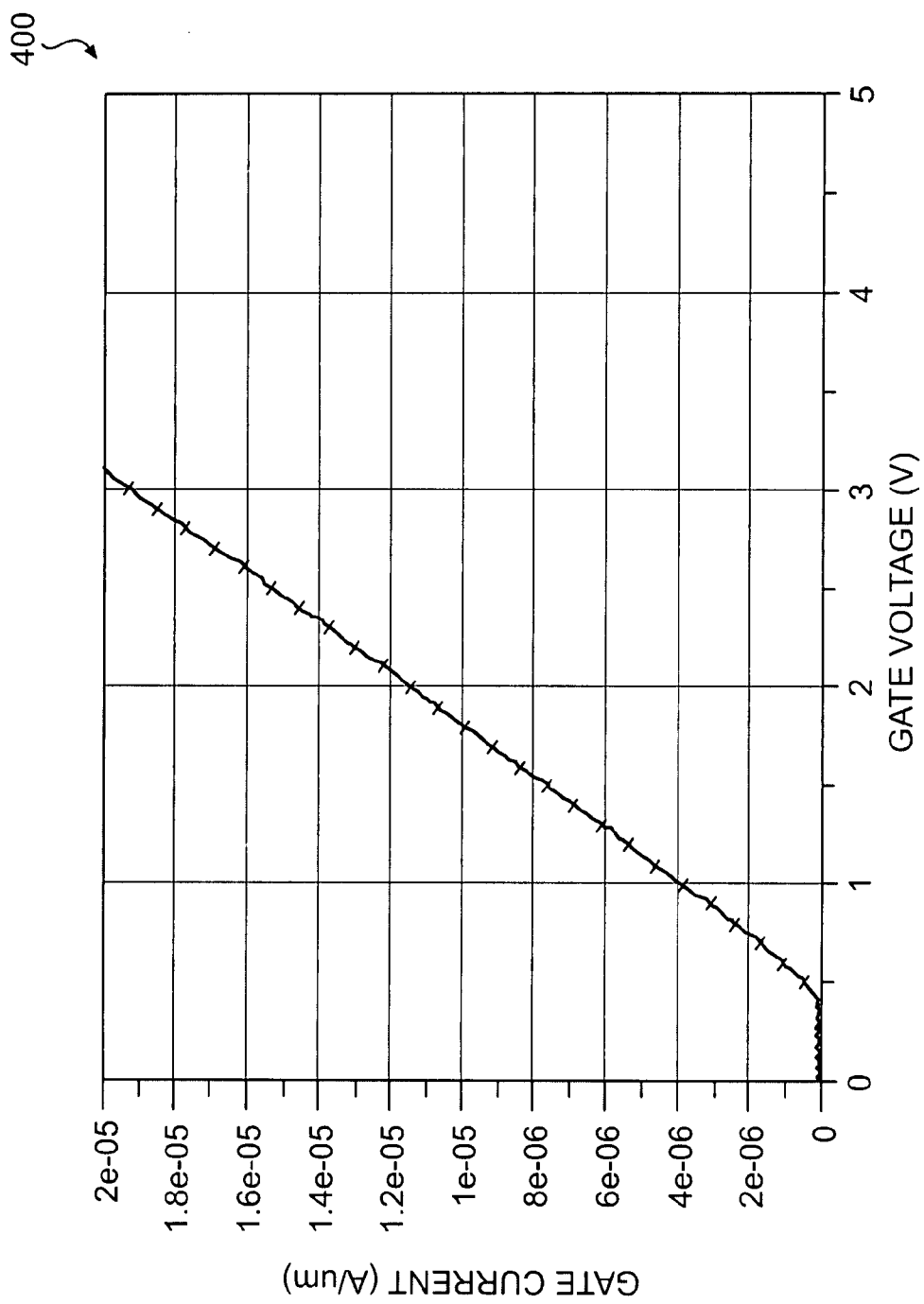
FIGS. 4-6 are graphs illustrating the integrated VJFET/JBSD device operation.
Figure 5:
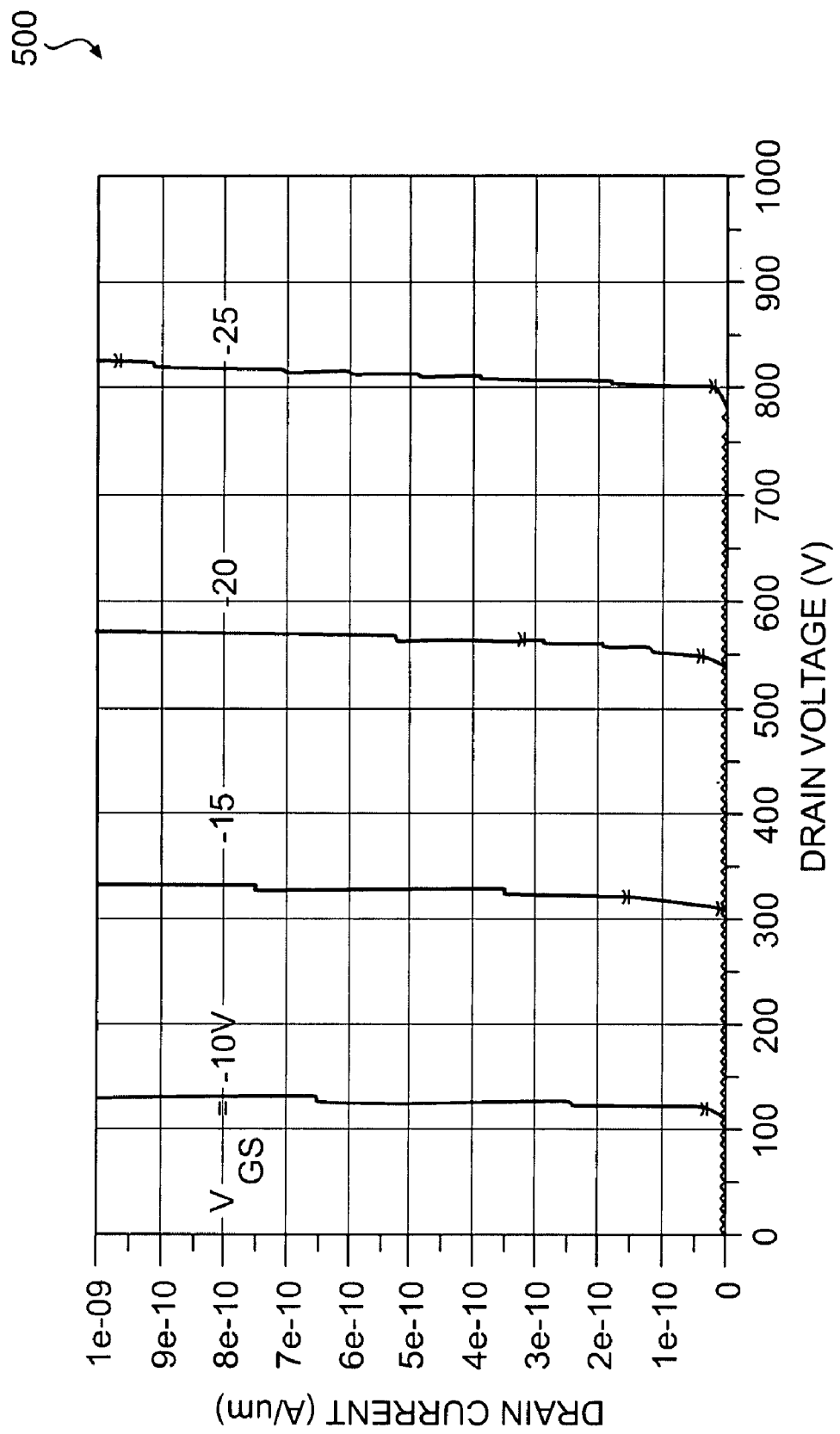
Figure 6:
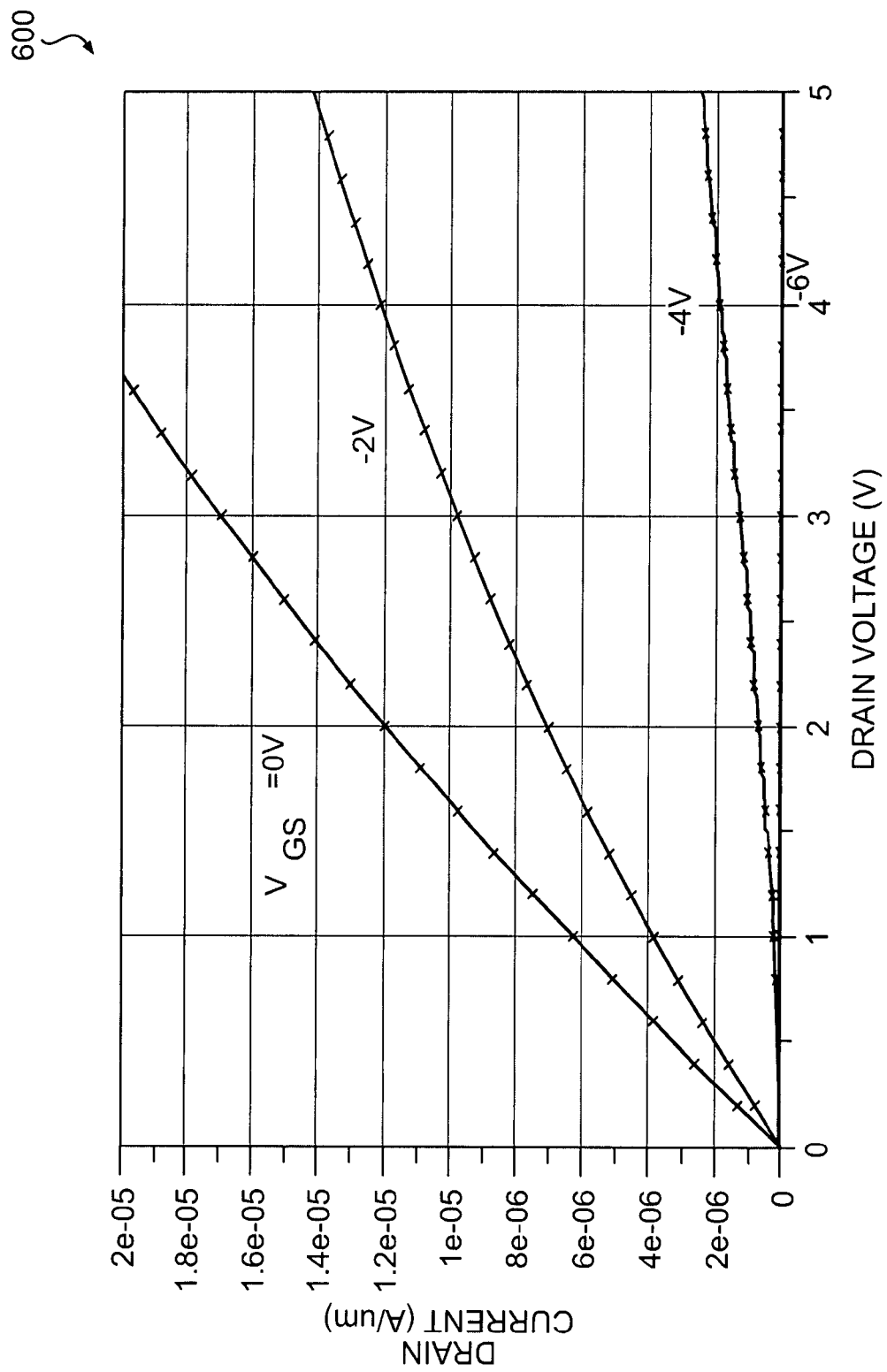

FIGS. 4-6 are graphs 400, 500, and 600, respectively, illustrating a simulated integrated VJFET/JBSD device operation using device modeling software. The graphs 400, 500 and 600 confirm that integrated VJFET/JBSD device functions as a normally-on VJFET with the advantages of an integral JBSD. FIG. 4 shows that as the gate-drain voltage of the integrated VJFET/JBSD device is increased from approximately 0.5 volts to over 3 volts (X-axis), the gate current increases from zero to $2\times10^5$ A/µm (Y-axis). In this simulation, the gates (including the Schottky contacts) are biased in the forward direction and the source left floating. Based on the graph 400, it can seen that the Schottky gate-drain diode turns "on" as expected.

If the gates of the integrated VJFET/JBSD device are left at zero or less and the drain-source of the integrated VJFET/JBSD device biased positive, the device acts as a "normally-on" VJFET with a pinch-off voltage of $V_{GS}=-25\,V$ at voltage drain to source ($V_{DS}$)=800 V, as can be seen in graph 500, FIG. 5. Graph 500, shows the drain voltage $V_{DS}$ (X-axis) and the drain current (Y-axis) as the $V_{GS}$ varies from $-10\,V$ to $-25\,V$.

FIG. 6 illustrates graph 600 that shows the "normally-on" forward characteristics integrated VJFET/JBSD device. Graph 600 shows the drain voltage (X-axis) and the drain current (Y-axis). As shown in graph 600, if $V_{GS}=0$, the device is turned "on" and as the drain voltage ($V_{DS}$) increases from 0 to approximately 3.6 volts, the drain current increases from zero to $2\times10^5$ A/µm. As $V_{GS}$ is decreases from, for example, $-2V$ to $-6V$, even though the drain voltage increases, the drain current decreases drastically, as shown in FIG. 6. As the $V_{GS}$ reaches the "pinch off" voltage, the drain current is almost zero and the integrated VJFET/JBSD device is turned off.

Figure 7:
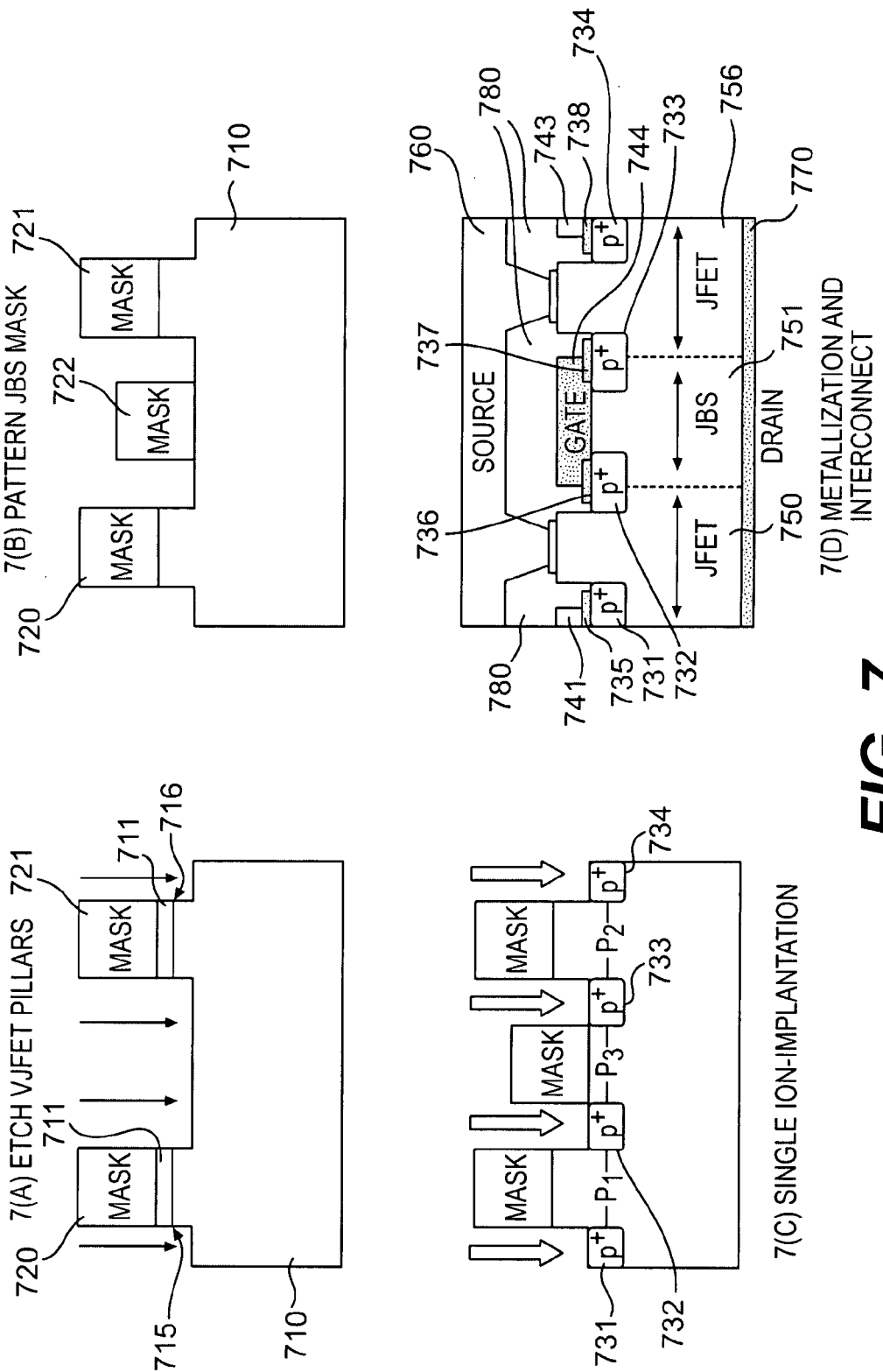
FIG. 7 illustrates a method for fabricating integrated VJFET/JBSD device, in accordance with an embodiment.

FIG. 7 illustrates a method for fabricating an integrated VJFET/JBSD device, such as the device 200, in accordance with an embodiment. Although the description below is provided for an N-type device, the process and techniques described herein may also be applied to a P-type device by replacing the N-type material with P-type material, P-type material with N-type material, and by reversing the electrode polarities. An underlying semiconductor substrate 710 containing silicon (Si), SiC, other material, or any combination thereof, may be used for the integrated VJFET/JBSD device. The substrate 710 may include a top layer, for source contacts, that may be doped with a higher carrier concentration. For example, for a N-type device, the top layer is a N+ source contact layer. However, for a P-type device, the top layer is a P+ source contact layer. As shown in FIG. 7(a), masks 720 and 721 are patterned and source pillars 715, 716 are etched into the substrate 710. The N+ source contact layer 711 remains for the source pillars 715 and 716 but is removed for both the p$^+$ regions and the Schottky region.

As shown in FIG. 7(b), an additional mask 722 is patterned on the substrate 710. An ion-implantation is performed to create all P+ regions 731, 732, 733 and 734, as shown in FIG. 7(c), for the N-type device. The spacing between the P+ regions P1, P2, and P3, can typically range from 0.5 to 10 micrometers. The ion-implantation may be a single implantation or may include multiple implantations. Alternate approaches to creating the P-type gate regions include diffusion and epitaxial regrowth. For a P-type device, an ion-implantation is performed to create N+ regions. A metallization and interconnect process is used to create the gate, source and drain contacts. Ohmic gate contacts 735, 736, 737, and 738 are formed on the P+ regions 731, 732, 733 and 734, as shown in FIG. 7(d). Schottky gate regions 741, 744 and 743 are then formed to make Schottky contacts to the semiconductor channel and ohmic contacts to the p+ gates 735, 736, 737, and 738. These regions are connected together outside of the plane of the figure to form a single gate contact for the integrated VJFET/JBSD device. An insulator 780 is deposited over the gate contacts 741, 744 and 743. Source contact 760 are then formed for the integrated VJFET/JBSD device. The drain contact 770 is also formed for the device.

In accordance with an embodiment, the integrated VJFET/JBSD device, as shown in FIG. 7(d), includes a first VJFET 750, a JBS diode 751 and a second VJFET 770. The Schottky contact 744 for the JBS diode is formed by omitting the ohmic contact that exists on the P+ regions 732, 733 surrounding the Schottky contact 744.

Figure 8:
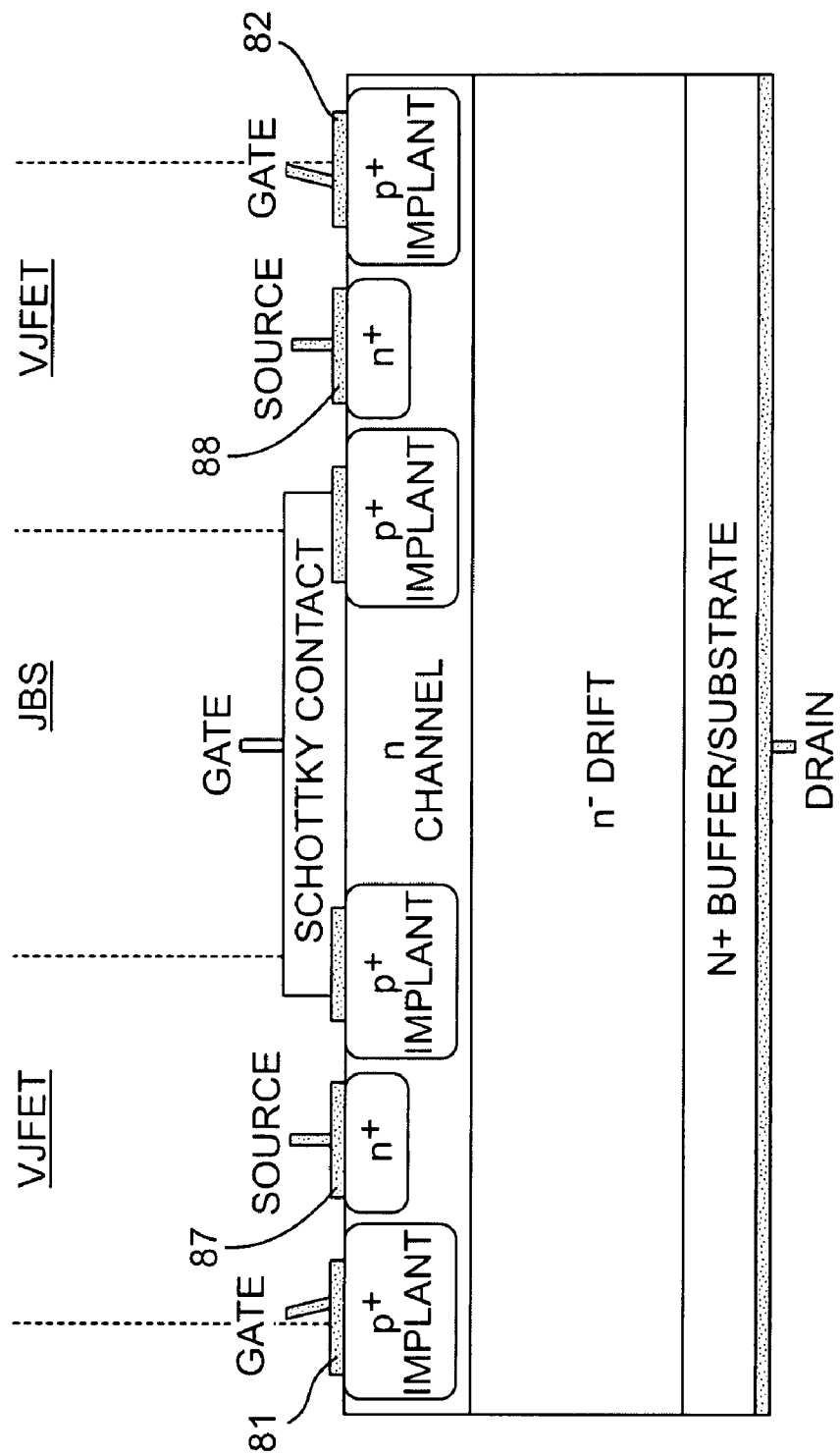
FIG. 8 illustrates an integrated VJFET/JBSD device having a planar (non-recessed) gate structure, in accordance with an embodiment.

FIG. 8 illustrates an integrated VJFET/JBSD device having a planar (non-recessed) gate structure, in accordance with an embodiment. As shown, the gates 81 and 82 are planar to the sources 87, 88 and offer the features of the integrated VJFET/JBSD devices (described above).

Figure 9:
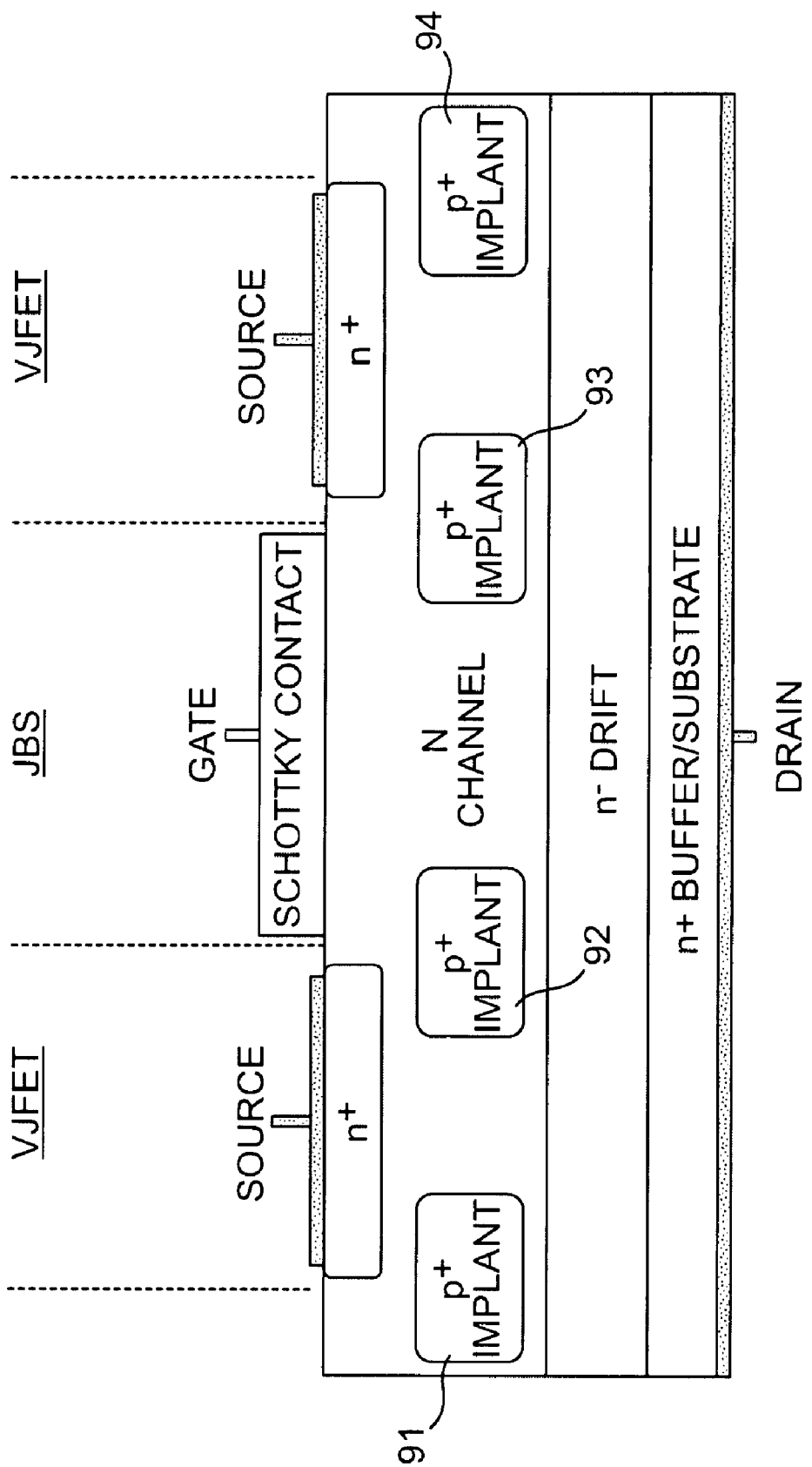
FIG. 9 illustrates an integrated VJFET/JBSD device having a buried-gate structure, in accordance with an embodiment.

FIG. 9 illustrates an integrated VJFET/JBSD device having a buried-gate structure (e.g., gates 91, 92, 93 and 94 are buried), in accordance with an embodiment.

Figure 10:
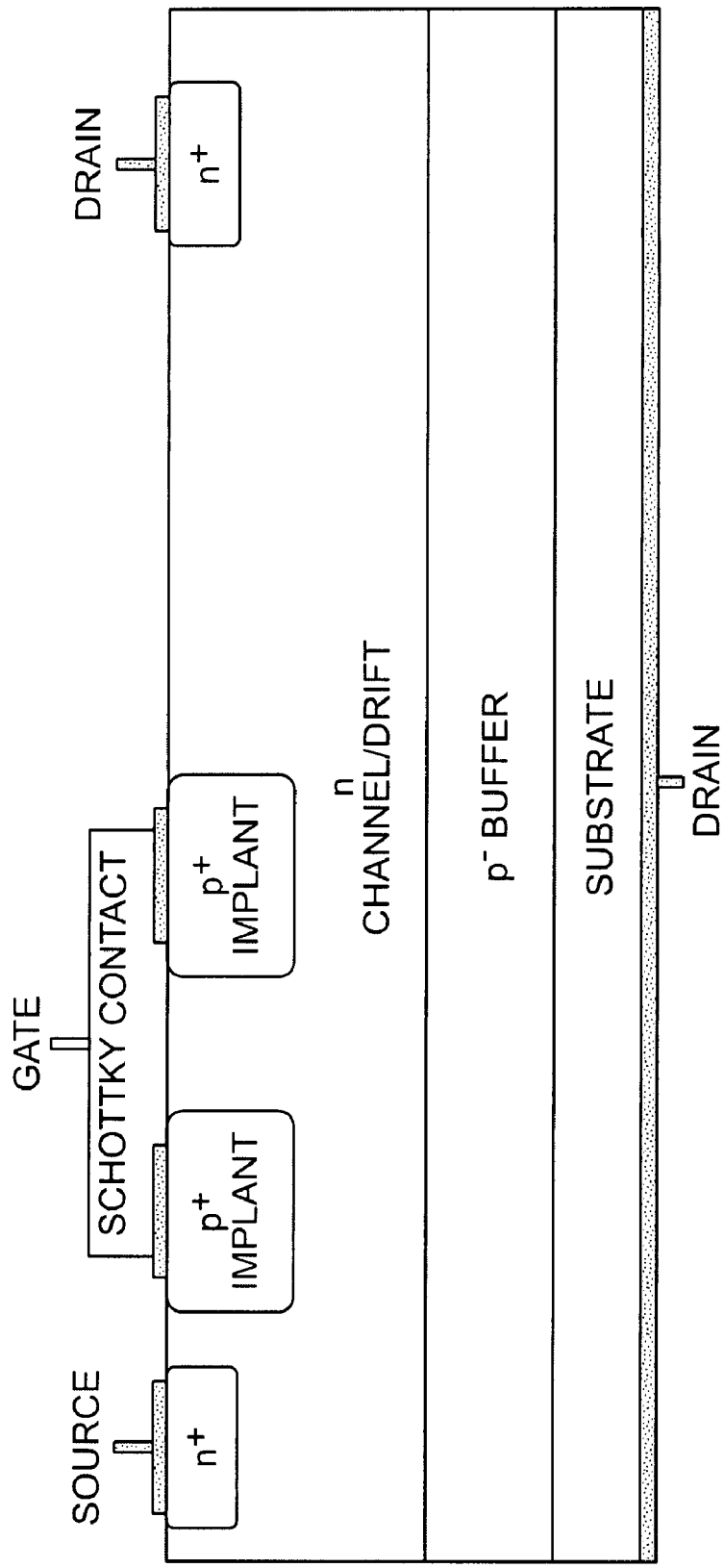
FIG. 10 illustrates an integrated VJFET/JBSD device having a lateral JFET structure, in accordance with an embodiment.

FIG. 10 illustrates an integrated VJFET/JBSD device having a lateral JFET structure, in accordance with an embodiment.

Figure 11:
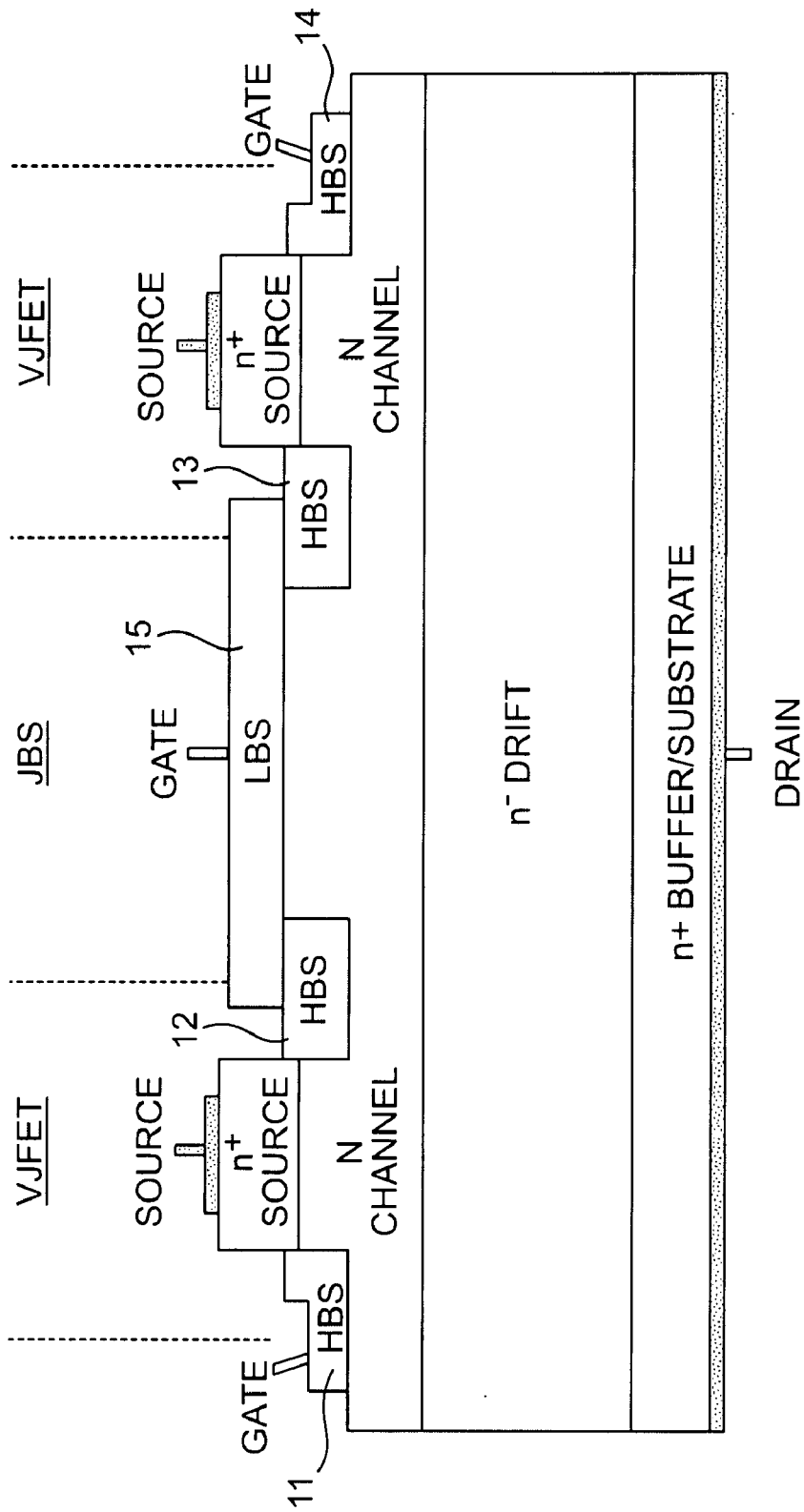
FIG. 11 illustrates a VJFET with Schottky gates having a "dual-metal" Schottky configuration, in accordance with an embodiment.

In accordance with an embodiment, a VJFET with Schottky gates may be integrated with and a "dual-metal" Schottky diode as illustrated FIG. 11. In this embodiment, a high-barrier Schottky (HBS) metal is used as the gates 11, 12, 13 and 14 of the VJFET and the shielding regions of the diode, and a low-barrier Schottky (LBS) metal is used as the main contact 15 of the diode.

Figure 12:
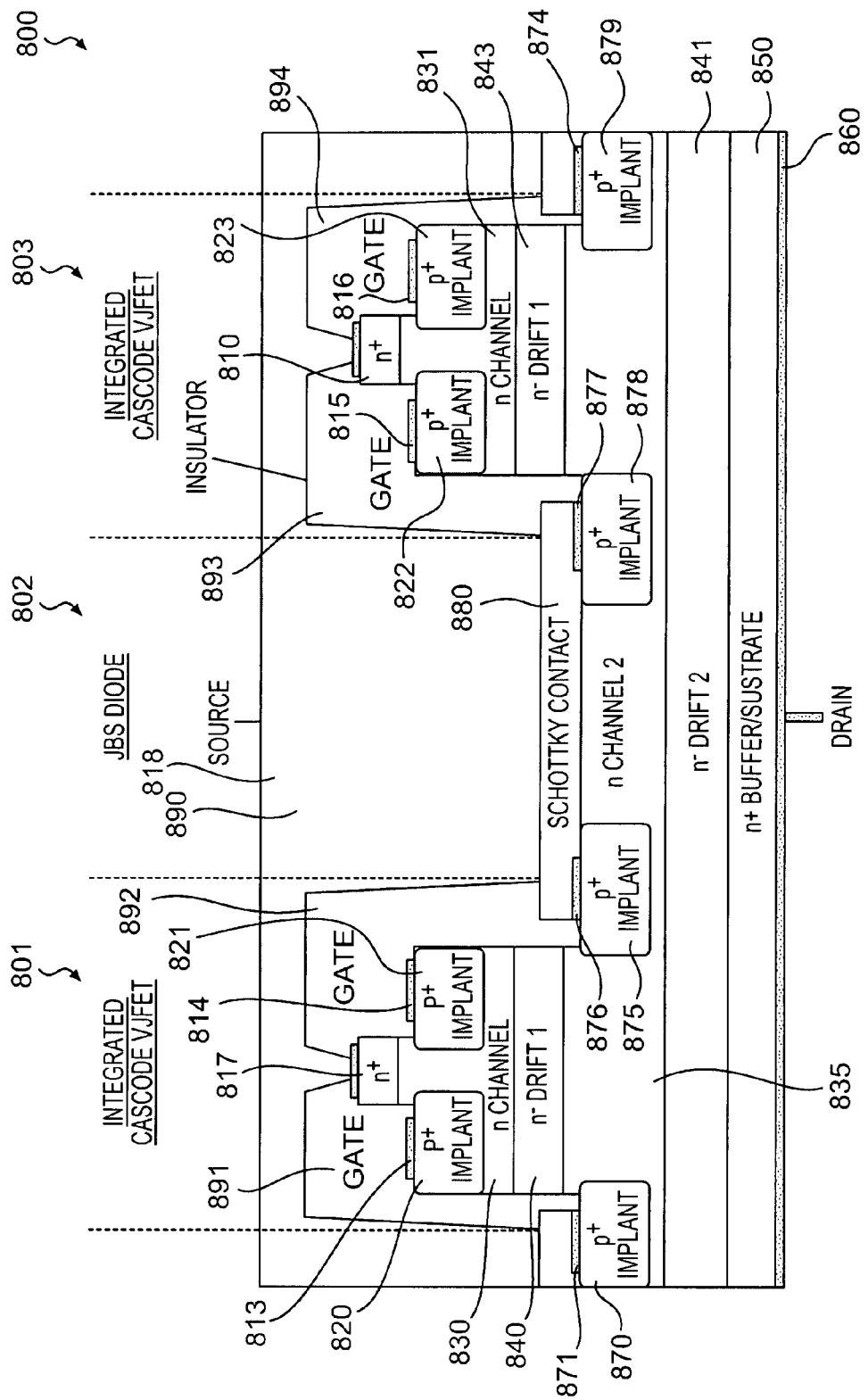
FIG. 12 illustrates a dual-gated integrated VJFET/JBSD device, in accordance with an embodiment.

FIG. 12 illustrates a dual-gated integrated VJFET/JBSD device 800, in accordance with an embodiment. The dual-gated integrated VJFET/JBSD device 800 is configured to include two sets of gates, an upper gate to control the "normally-off" position and a lower gate to control the "normally-on" position.

In the dual gated integrated VJFET/JBSD device, shown in FIG. 12, the first VJFET, VJFET 801 includes a source 818 and a N+ source region 817. A first channel 830 is disposed under the source 817, as shown. The first N-channel 830 separates upper gates including first gate 813 and an P+ implant 820, from second gate 814 and P+ implant 821. VJFET 801 includes a first N− drift region 840. The first VJFET 801 also includes a first set of lower gates including first gate 871 and an P+ implant 870 and second gate 876 and P+ implant 875. The lower gates are separated by a second N-channel 835. The second n-channel 835 is disposed on a second N− drift region 841, which is disposed on a N+ buffer/substrate 850. The N+ buffer/substrate 850 is connected to a drain 860 of the dual-gated integrated VJFET/JBSD device 800.

As shown in FIG. 12, the second VJFET 803 includes a source 818 common with the VJFET 801 and a N+ source region 810. The second N-channel 831, is disposed under the N+ source region 810, as shown. The second N-channel 830 separates upper gates including first gate 815 and an P+ implant 822, from second gate 816 and P+ implant 823. Second VJFET 803 shares has a N-drift region 843, as shown. The second VJFET 803 also includes a second set of lower gates including first gate 877 and an P+ implant 878 and second gate 874 and P+ implant 879. The lower gates are separated by the second N-channel 835. The second n-channel 835 is disposed on the second N− drift region 841, which is disposed on the N+ buffer/substrate 850. The N+ buffer/substrate 850 is coupled to the drain 860 of the dual-gated integrated VJFET/JBSD device 800.

In accordance with an embodiment, the dual-gated integrated VJFET/JBSD device 800 is configured to include two sets of gates, upper gates 813, 814 815 and 816 to control the "normally-off" position and lower gates 871, 876, 877 and 874 to control the "normally-on" position. Due to the small spacing between the upper gates (i.e., gates 820 and 821, and 822 and 823), the built-in depletion regions will pinch-off the channels 830, 831 with no applied bias between gate and source (i.e., $V_{GS}=0$ V). In this case, the upper gates provide a device 800 which is "normally-off." A positive voltage $V_{GS}$ must be applied to the gate to reduce the built-in depletion region and turn the device 800 "on." In an embodiment, the common source 818, which may be a interconnect metal, may be used to connect the sources of the VJFETs 801, 803, as shown. The common source 818 is insulated from upper gates by an insulator 891, 892, 893 and 894.

The lower gates 871, 876, 877 and 874 provide a normally "on" device. The larger spacing between the P+ gate regions 870 and 875, and 878 and 879 permit a current to flow through the second N-channel 835, between the gate regions, at $V_{GS}=0$ V. The lower gates are connected to the sources through source contact 818. If the upper normally-off portion of the devices are in the "off" state and the drain-source voltage ($V_{DS}$) is positive, a negative voltage will appear between the second n-channel 835 and the lower gates 871, 876, 877, and 874. This switches the lower normally-on portion of the devices off. If the upper "normally-off" portion of the devices are in the "on" state", current will flow through both portions of the device and the combined switch is "on". The dual-gate device 800 advantageously connects a normally-off VJFET and normally-on VJFET in cascode configuration in a single device, thus reducing the cost and complexity of the circuit.

As shown in FIG. 12, the Schottky contact 880 makes a Schottky (rectifying) contact to the lower semiconductor channel 835 and ohmic contacts to the lower gates 871, 876, 877 and 874. The JBS diode 802 is formed on a substrate that includes the second N-drift layer 841, N+ buffer/substrate 850 and drain 860. In this manner, three devices (normally-off VJFET, normally-on VJFET, and anti-parallel JBS diode) are combined into a single device, reducing the cost and complexity of the power conditioning circuits.

Although the integrated VJFET/JBSD devices, as shown in the figures and described herein, only show two source/gate sets, an integrated VJFET/JBSD device may be configured to include hundreds or thousands or repeating gate/source connections for a device with high currents.

In a high-power transistor containing many sets of sources and gates, the VJFET/JBSD can be integrated in two different ways. The first method is to interdigitate a JBS diode finger in between every VJFET finger. For high-voltage devices, this method of integration should not significantly reduce either device's performance. For high-voltage majority-carrier devices, the drift region is typically thick (10-100 µm) and lightly doped ($10^{14}$-$10^{15}$ cm$^{-3}$) and dominates the "on" state resistance. As a result, a lower density of fingers for both the VJFET and JBS diode may be able to be accommodated without significantly increasing the resistance of either device. This allows the integration of two high performance devices in the same area as one. The second method is to form separate groups of VJFET fingers and JBS diode fingers, all within the same edge termination, but not interdigitated. This will require more area than the interdigitated approach to achieve the same performance, but may have advantages regarding interconnecting the fingers to bond pads.

In an alternate embodiment, the ohmic contacts to the P+ gates of the VJFET could be omitted from the structure. The Schottky contact would then be used to contact both the semiconductor channel of the JBS diode and the p+ gates of the VJFETs. This will not alter the pinch-off voltage of the normally on device appreciably. The gate-source pinch-off voltage is typically −20 V. Due to the Schottky junction at the P+ gate contact, an additional 1 V drop may be introduced, lowering it to −21 V. This should not have much effect on the cascode circuit.

Figure 13:
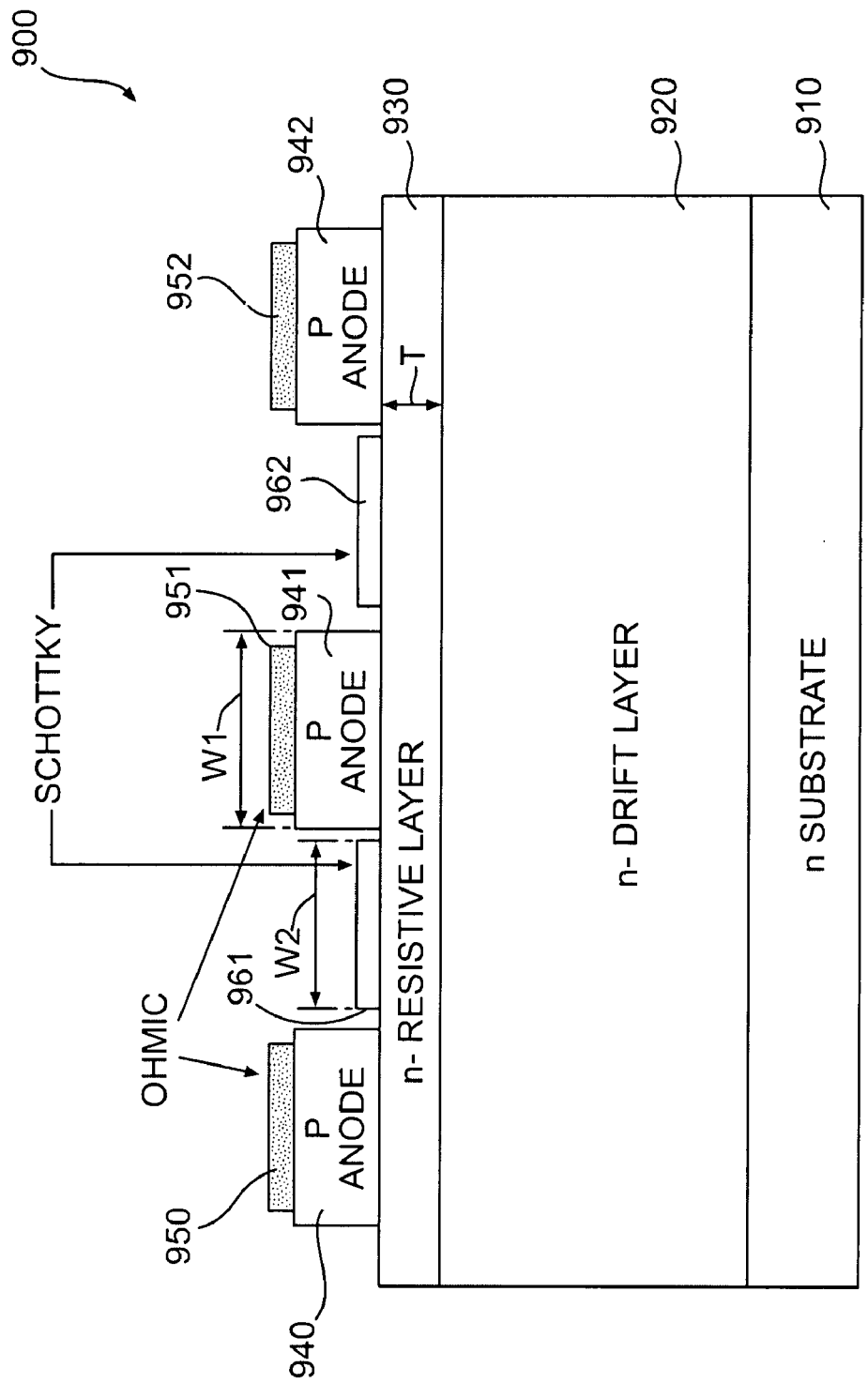
FIG. 13 illustrates a Merged-PiN-Schottky (MPS) diode with an epitaxial N-resistive layer, in accordance with an embodiment.

FIG. 13 illustrates an improved recovery surge current capable rectifier 900 with an N-resistive layer 930 and epitaxial P anode pillars 940-942, in accordance with an embodiment. As shown, the improved recovery rectifier 900 may be fabricated on a N substrate 910, such as SiC. The improved recovery rectifier 900 includes a N− drift layer 920 and a N− resistive layer 930. The improved recovery rectifier 900 includes P anode pillars 940, 941 and 942 fabricated on the N-resistive layer 930. The P anode pillars 940, 941 and 942 include ohmic contacts 950, 951 and 952, respectively. The ohmic contacts allow low resistance access to the P anode pillars. The ohmic contacts may provide a linear and symmetric current-voltage (I-V) characteristic for the contact. The ohmic contacts may be sputtered or evaporated metal pads that are patterned using photolithography.

The P anode pillars 940, 941 and 942 are fabricated using a epitaxial process. As shown, Schottky contacts 961 and 962 that deposited on the N− resistive layer 930 between the P anode pillars 940, 941 and 942, as shown. The Schottky contacts 961 and 962 may provide a Schottky barrier (rectifying contact), where the junction conducts for one bias polarity, but not the other. The Schottky diode may provide non-linear and asymmetric I-V characteristics for the contact. The N− resistive layer 930 is added to the improved recovery rectifier 900 to cause the PN junction (junction at P anode and the N− resistive layer) of the device to turn "on" at lower voltages, thus reducing on-resistance of the device.

Figure 14:
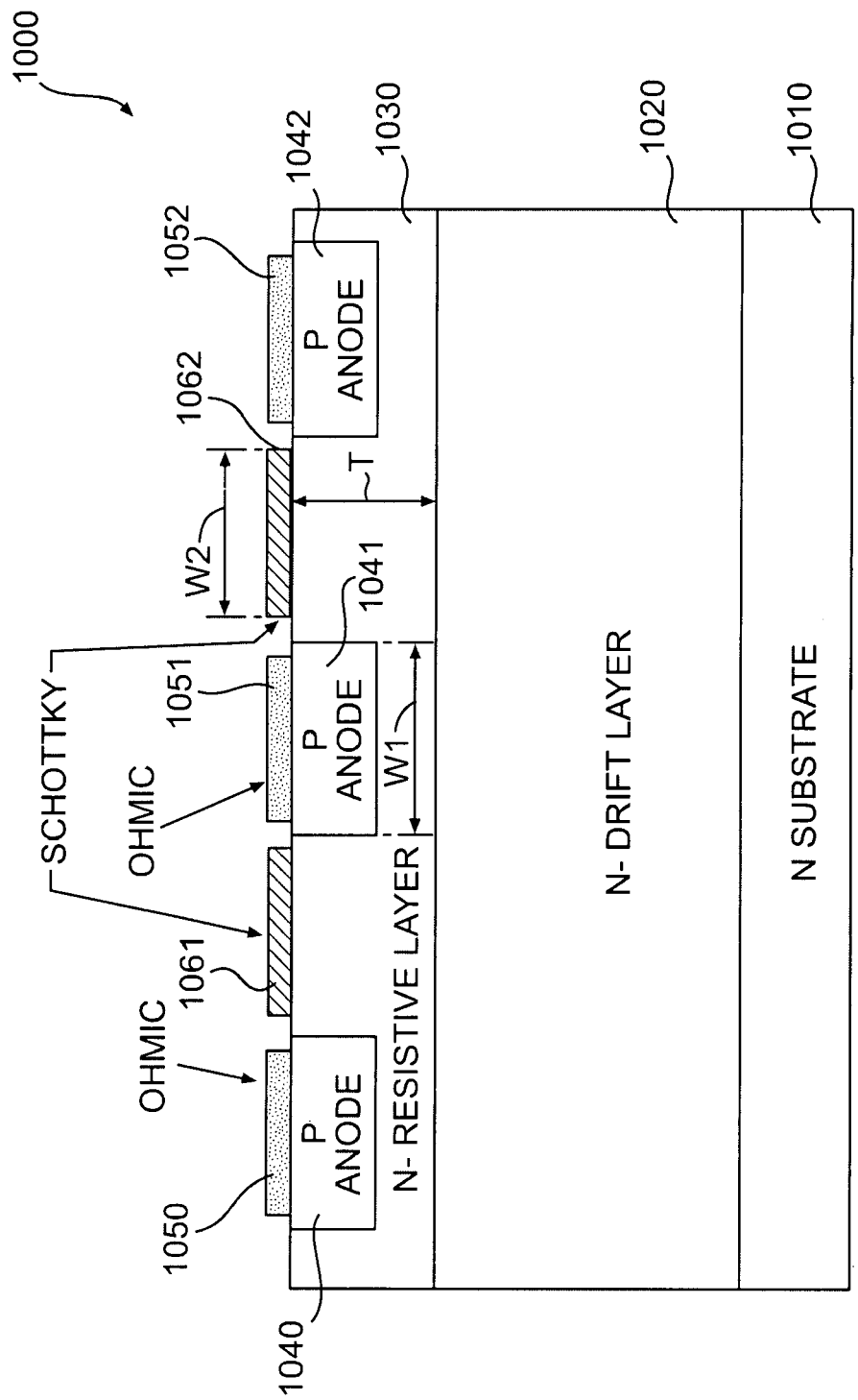
FIG. 14 illustrates MPS diode with an implanted N-resistive layer, in accordance with an embodiment.

FIG. 14 illustrates another embodiment of an improved recovery surge current capable rectifier 1000 with an N-resistive layer 1030 and P anode implants 1040-1042. The P anode implants 1040-1042 are implanted in the N− resistive layer 1030. As shown, the improved recovery rectifier 1000 may be fabricated on a N substrate 1010, such as SiC. The rectifier 1000 includes a N-drift layer 1020 and a N− resistive layer 1030. The P anode regions 1040, 1041 and 1042, implanted in the N− resistive layer, that include ohmic contacts 1050, 1051 and 1052, respectively. The ohmic contacts allow low resistance access to the P anode implants. The ohmic contacts may provide a linear and symmetric current-voltage (I-V) characteristic for the contact.

The P anode regions 1040, 1041 and 1042 are implanted into the N− resistive layer 1030. As shown, Schottky contacts 1061 and 1062 are deposited on the N− resistive layer 1030 between the P anode implant regions 1040, 1041 and 1042. The Schottky contacts 1061 and 1062 may provide a Schottky barrier (rectifying contact), where the junction conducts for one bias polarity, but not the other. The Schottky diode may provide non-linear and asymmetric I-V characteristics for the contact. The N− resistive layer 1030 is added to the rectifier 1000 to cause the PN junction (junction at P anode and the N− resistive layer) of the device to turn "on" at lower voltages, thus reducing on-resistance of the device.

Figure 15:
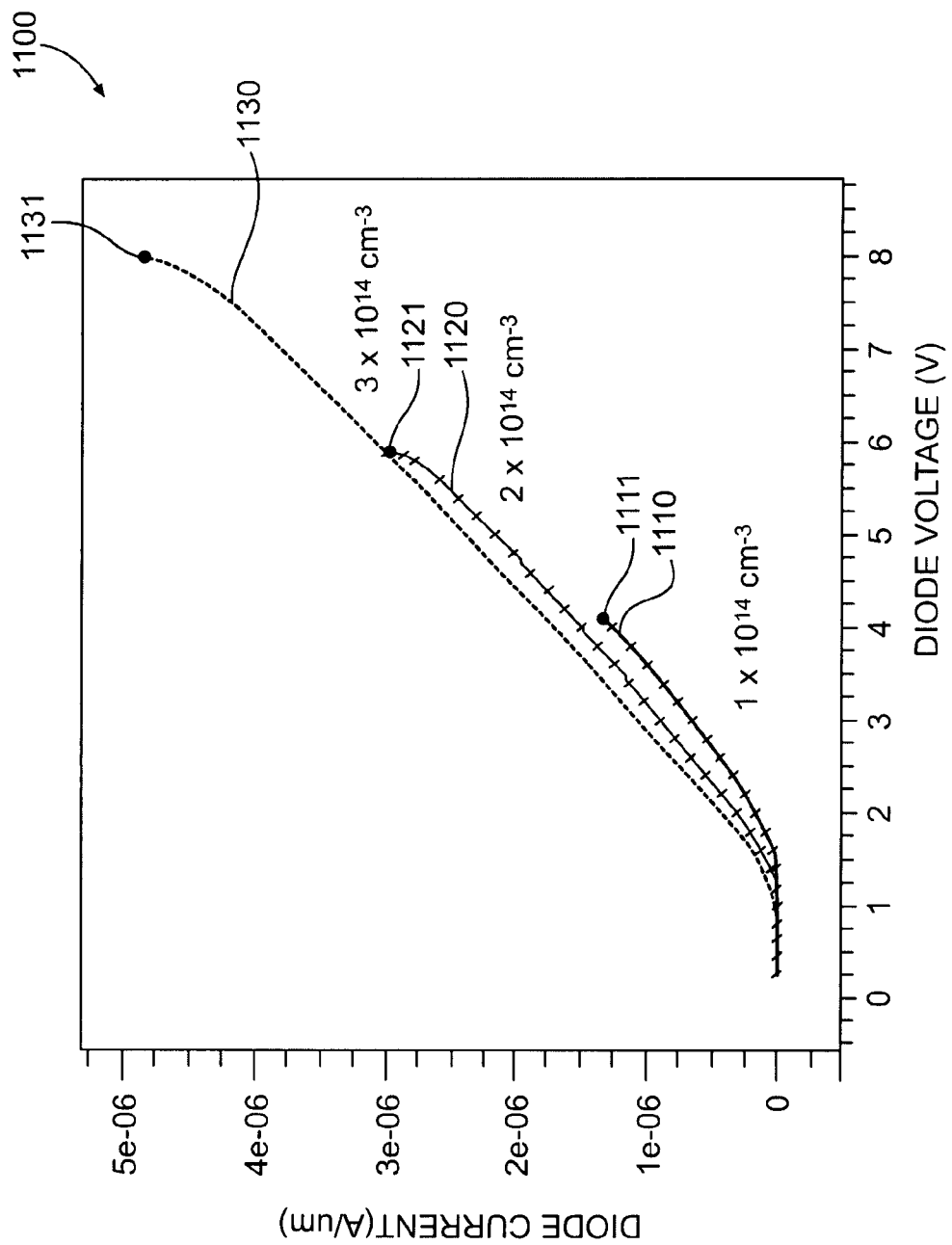
FIG. 15 shows graph depicting modeling results of an epitaxial MPS diode with an N-resistive layer to activate the PN junction.

FIG. 15 shows graph 1100 depicting numerical modeling results of an epitaxial rectifier (e.g., rectifier 900) with an N− resistive layer to activate the PN junction. The X-axis shows the rectifier's forward biased voltage (V) and the Y-axis shows rectifier's current (A/µm). In these simulations, the N− layer (e.g., 930) was fixed at approximately 4 µm thick (T), the P anode pillars (e.g., 940, 941, and 941) were fixed at approximately 10 µm in width (W1), and the Schottky contact (e.g., 961 and 962) was approximately 3 µm wide (W2). Graph 1100, shows three curves showing the various dopings of the N− resistive layer. The PN junction of rectifier turns on at lower voltages as the resistivity of the N− layer increases. Therefore, the PN junction turn-on can be tailored by adjusting the N− layer doping, depth, and P anode spacing for a given N− layer resistive layer doping. For example, curve 1110 shows a doping of $1\times10^{14}$/cm$^3$, curve 1120 shows a doping of $2\times10^{14}$/cm$^3$, and curve 1130 shows a doping of $3\times10^{14}$/cm$^3$. As can be seen by the graph 1100, at a doping of $1\times10^{14}$/cm$^3$, the PN junction will turn "on" at a voltage of approximately 4 volts (data point 1111). As the N− resistive layer doping levels are increased, the turn-on voltage for the PN junction also increases. Data points 1111, 1121 and 1131 represent the current through the ohmic contacts since the ohmic contacts require greater turn-on voltages. Thus, adjusting the various parameters and providing a N− resistive layer helps to increase the voltage drop across the pn junction, hence the pn junction turn-on voltage can be lowered to turn on at a specific forward voltage across the rectifier and reduce the on-resistance of the device. The doping of the N− resistive layer may range up to the doping of the N− drift layer. Applications requiring surge current, e.g., for system start-up conditions, require that the p-n junctions turn on to inject minority carriers, thus drastically lower the forward on-resistance at the desired forward voltage. The Schottky contact can act as a recombination source for minority carrier holes during reverse recovery, thus speeding up the turn off process. Tailoring the low-doped resistive layer 930 or 1030 allows for the surge current to occur only under stress conditions and not during normal operation.

In an embodiment of the rectifier 900 and rectifier 1000, the thickness T of the N-resistive layer may range from 0.2 to 5 micron meters in thickness, the width (W1) of the P anode pillars may range from 0.5 to 12 micron meters, and/or the width (W2) of the Schottky contact may range from 0.5 to 8 micron meters in width.

Figure 16:
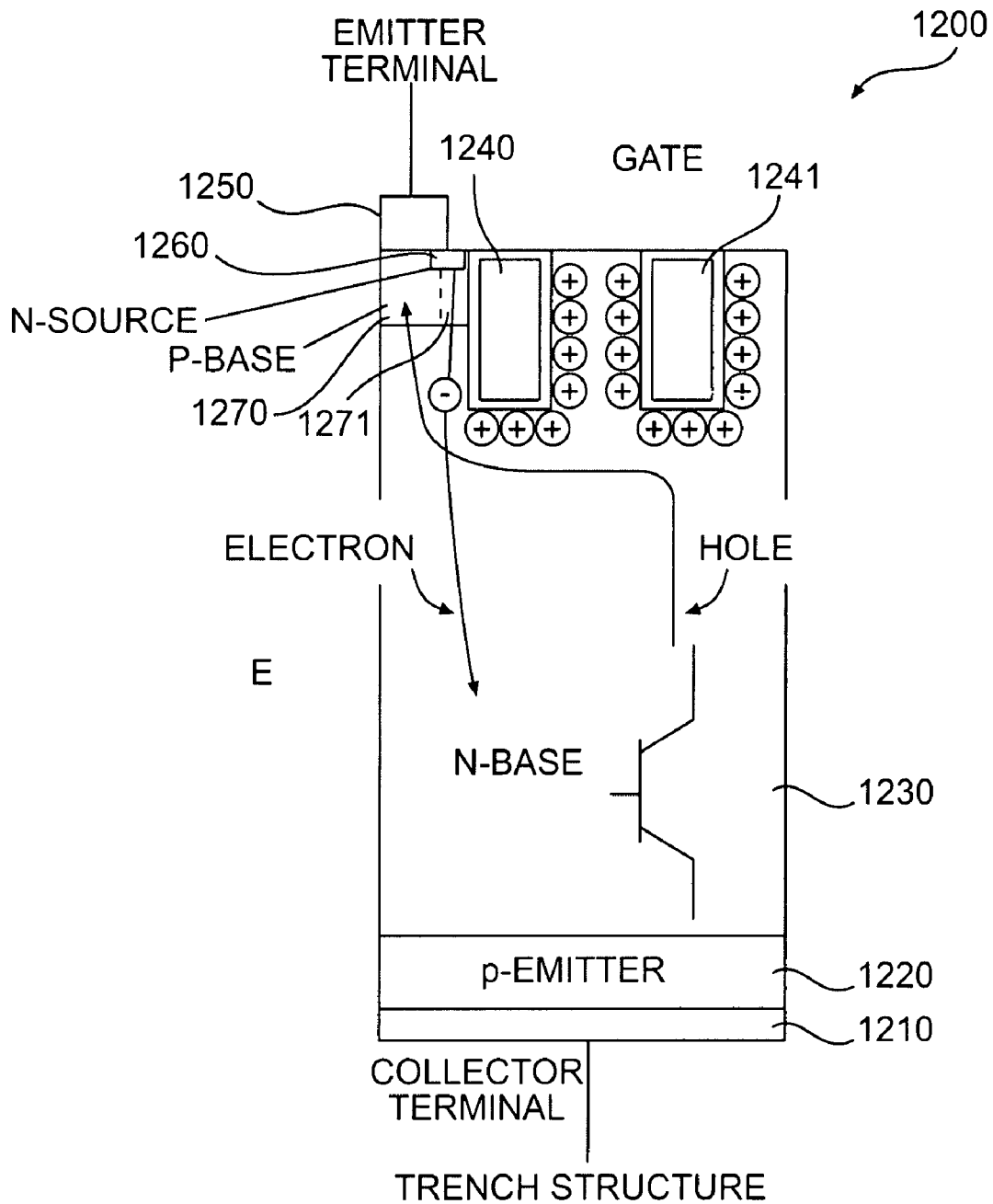
FIG. 16 illustrates a vertical channel trenched structure insulated gate bipolar device (IGBT) 1200 configured using Si.

FIG. 16 illustrates a vertical channel trenched structure insulated gate bipolar device (IGBT) 1200 configured using Si. By using a trench gate structure and controlling the pitch of the cell, enhanced injection in the IGBT base may be produced. The enhanced injection reduces on-states losses without dramatic increases in switching losses in an IGBT. The vertical channel trenched structure insulated gate bipolar device (IGBT) 1200 includes a collector terminal (or anode) 1210, a P emitter region 1220, a N base 1230, a pair of vertical trenched gates 1240, 1241, a P base 1270, a N source 1260 and an emitter terminal (or cathode) 1250. In an embodiment, the gates 1240 and 1241 may be coupled with each other. Optionally, one of the gates 1240 and 1241 may be coupled to the emitter terminal 1250.

In the vertical channel IGBT 1220, if a positive voltage is applied to the vertical gates 1240, 1241, with respect to the emitter terminal 1250, a inversion layer (N channel) 1271 is formed in the P-type region between the pair of vertical gates 1240, 1241. The applied voltage creates channels, adjacent to the vertical gates 1240, 1241, in which electrons flow downwards away from the cathode in the inversion layer and holes flow up through the P base. This results in a low resistance region for the electrons in the channels 1240 and a large potential drop is created in the region between the channels 1240 for the holes to travel. Also, the structure provides no "JFET" resistance as in traditional DMOS (Double Diffused Metal Oxide Semiconductor) structures.

A conventional planar IGBT is a bipolar device that utilizes conductivity modulation in the thick drift region. During reverse blocking, the layer thickness and doping must be low enough to allow the blocking voltage to be dropped across the drift region. The low carrier concentration and the thick base layer of an IGBT is modulated by minority carriers (holes), injected from the lower p+ emitter region. The injected hole density in the N base can be very high (orders of magnitude higher than the background N type dopant density) and will effectively lower the on-state resistance. In silicon IGBTs, the design of the MOS channel can greatly effect the charge concentration in the base of the IGBT during the on-state. It has been found that making the P-body implant in an N-channel IGBT wide and deep or developing deep trench gate structures create a raised potential across the MOS channel. The raised potential results in increased electron current from the channel and results in the piling up of current on the emitter terminal 1250 or cathode. The result is a decrease in the base resistance (due to an increase in the base charge concentration) of the IGBT, without much increase in switching losses. In silicon, the dopants are diffused to construct the channel region, since the dopant diffusion rate in Si is high. Also, the material quality in Si is such that a MOS channel is easily produced that yields a high inversion layer mobility.

Moreover, in silicon carbide, the P well region of an IGBT is implanted using ion implantation. The diffusion coefficients in SiC are very low, and hence the dopants, for all practical purposes, do not diffuse. Therefore, the depth of the P well in SiC is limited to 1 micron or less. This limits the effectiveness of the planar device injection enhancement structure of a conventional IGBT. Furthermore, since the dopants must be implanted to the maximum depth of ~1 micron in the SiC IGBT structure to prevent latch-up, the channel region is highly damaged, dramatically reducing the inversion layer mobility.

Figure 17:
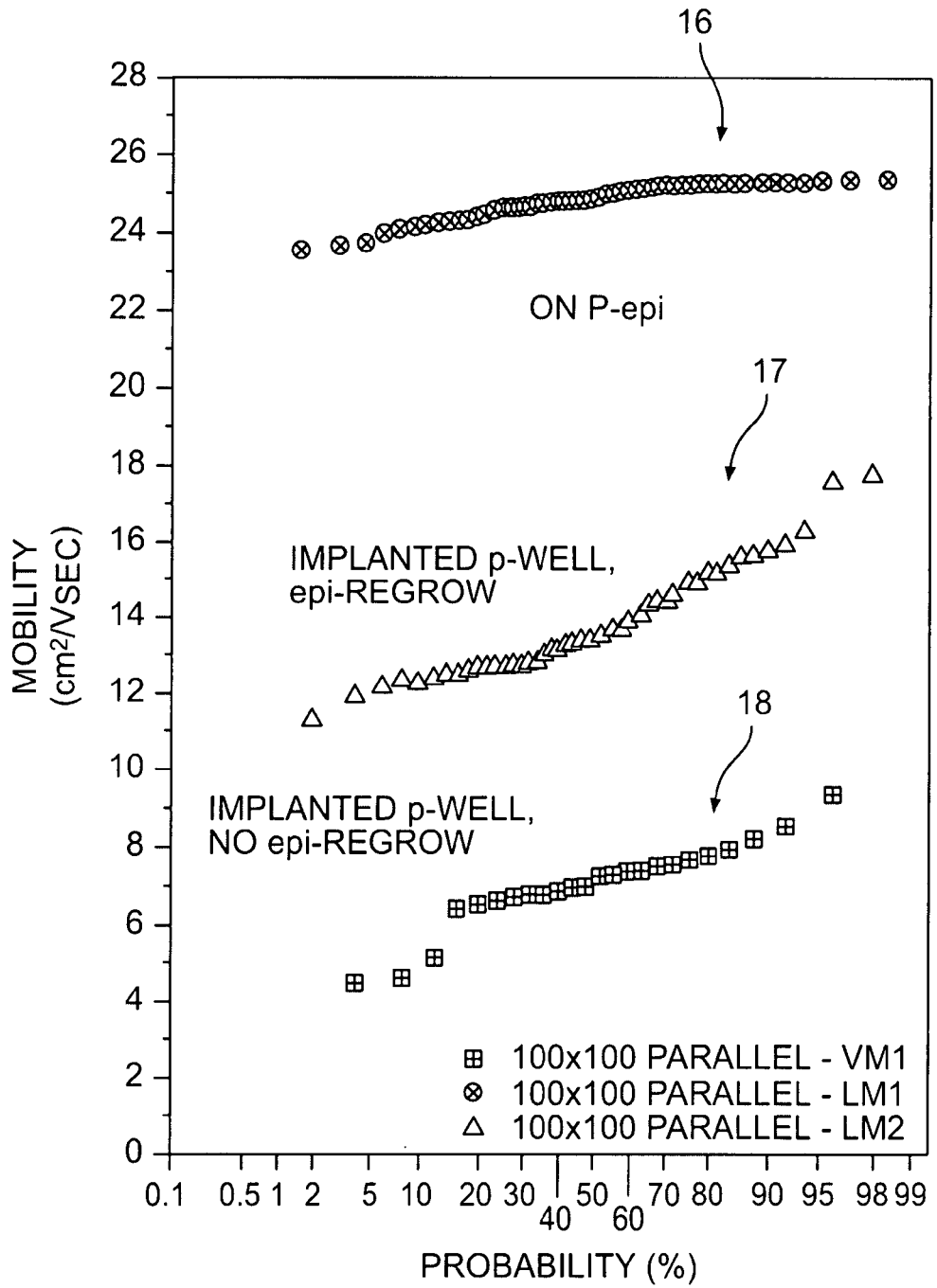
FIG. 17 illustrates a graph showing electron mobility using various layer configurations.

As descried herein, an injection enhanced IGBT is provided using an epitaxial P layer to form the channel layer. The epitaxial P layer (16) provides a much higher inversion layer mobility as compared to an implanted channel region (17, 18), as shown in FIG. 17. Furthermore, the invention utilizes the tight channel width to create a higher potential drop across the channel due to crowding of the hole current. As stated above, the crowding of the hole current increases the minority carrier concentration in the base, and hence reduces the on-state voltage drop across the IGBT.

Figure 18:
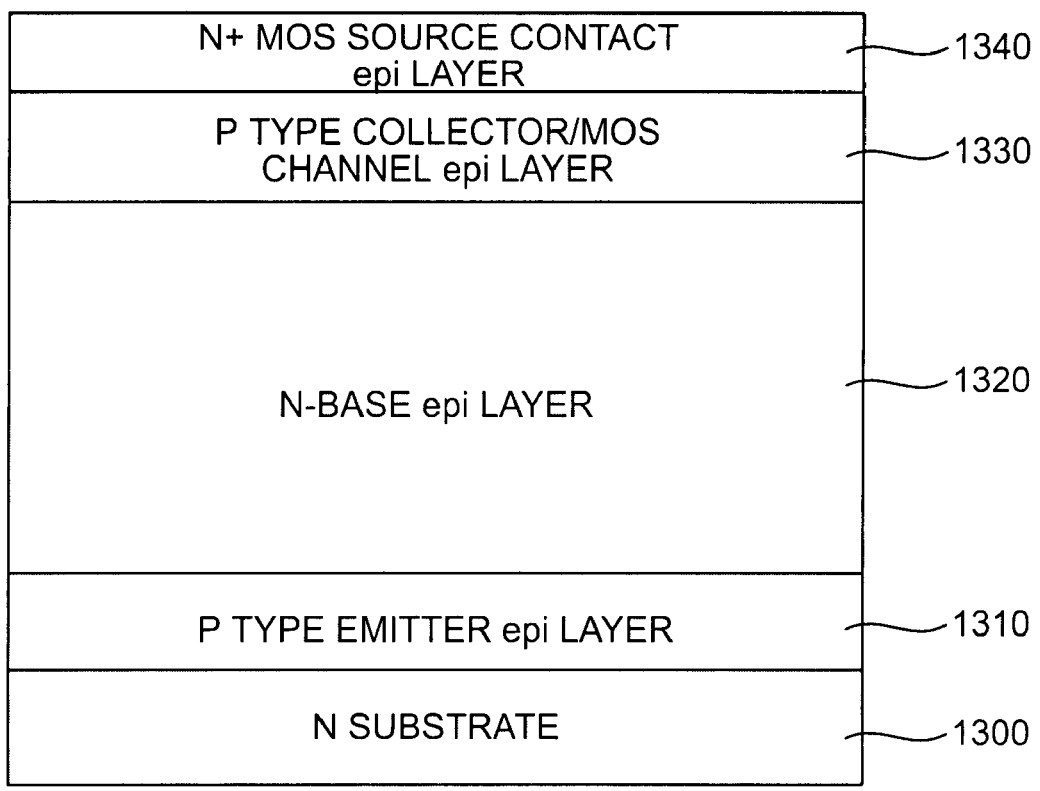
FIG. 18 illustrates device epitaxial layers needed for a SiC epitaxial injection enhanced IGBT device having a vertical channel trenched structure, in accordance with an embodiment.

FIG. 18 illustrates device epitaxial layers needed to develop a SiC epitaxial injection enhanced IGBT device having a vertical channel trenched structure, in accordance with an embodiment. Due to the lack of a highly conductive P type substrate in SiC, the epitaxial layer can be grown on an N-type substrate 1300. The N substrate can be lapped away to make a backside (anode) contact to the P type emitter epitaxial layer 1310. The P type emitter epitaxial layer 1310 is deposited with an N-base epitaxial layer 1320, which is deposited with a P type collector or metal oxide semiconductor (MOS) channel epitaxial layer 1330. A N+ MOS source contact epitaxial layer 1340 is deposited on layer 1330, as shown. In addition, the epitaxial layers can be grown in reverse order with the P injecting layer on top, and the substrate lapped away. The wafer may be flipped over, and the MOS portion of the IGBT can then be developed on the C-face, as is known.

Figure 19:
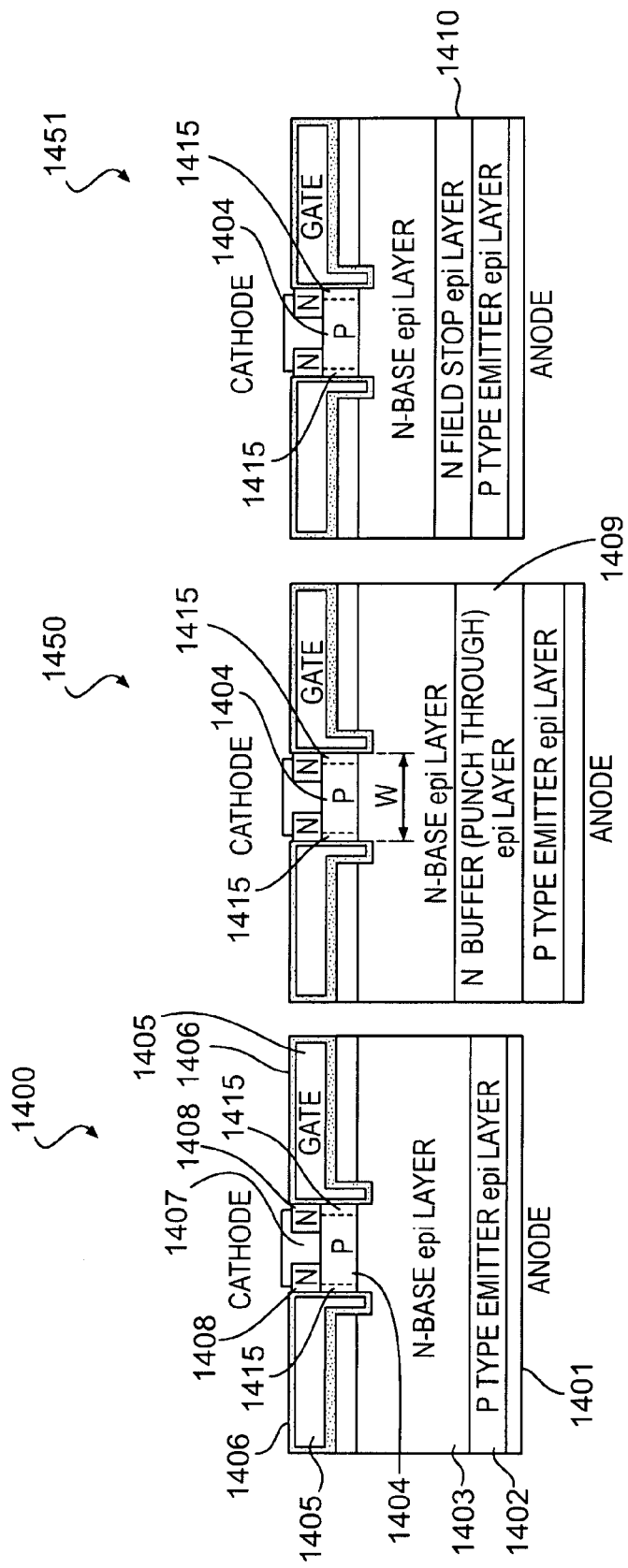
FIG. 19 shows various trench gate IGBT structures, in accordance with an embodiment.

FIG. 19 illustrates several IGBT technologies (e.g., non punch-through, punch-through, and field-stop IGBTs) implemented in SiC with epitaxial layers for injection enhancement. The non punch-through 1400, punch-through 1450, and field-stop IGBTs 1451, respectively, demonstrate trench gate injection enhanced IGBT structure using epitaxial P channel layer. Each IGBT technology has trade-offs of on-state versus switching losses, yielding application specific devices. The invention described herein can be implemented to further reduce the on-state losses for each technology.

FIG. 19 shows a non-punch through trench gate IGBT structure 1400, in accordance with an embodiment. The non-punch through trench gate IGBT 1400 includes an anode 1401, a P type emitter epitaxial layer 1402, a N– base epitaxial layer 1403, a MOS channel epitaxial layer 1404, poly silicon gate 1405, gate oxide 1406, cathode 1407 and N source contacts 1408. The devices shown in FIG. 19 may be created using SiC.

FIG. 19 shows a punch-through trench gate IGBT structure 1450, which is similar to the non-punch through trench gate IGBT structure 1400 but includes a N buffer punch-through epitaxial layer 1409. The punch-through epitaxial layer 1409 provides a thinner more lowly doped drift layer in order to decrease the slope of the electric field profile under reverse bias. This enables a trade-off in lowering the on-state resistance and the switching speed.

Further illustrated in FIG. 19 is a field-stop IGBT structure 1451 which is similar to the non-punch through trench gate IGBT structure 1400 but includes a N field stop epitaxial layer 1410. The N field stop epitaxial layer 1410 provides a decrease in the amount of charge in the P injecting layer. This decrease results in a decrease in injected charge in the IGBT drift layer during forward bias. Therefore, the switching losses in the IGBT are reduced by having the minimal amount of electron-hole plasma to distinguish at turn-off.

When a positive voltage is applied to the gate of the device, the IGBT structures 1400, 1450 and 1451 create vertical channels 1415 in the MOS region 1404 to generate increased potential or bias for holes to travel through the MOS region 1404. The P region 1404 may be between 0.1 to 3 micron meters (µm) in width (W). When a positive voltage is applied to the gate of the device 1400, 1450 or 1451, a inversion layer 1415 is formed in the P region 1404, in which electrons flow downwards away from the cathode 1407 and N source 1408. Holes then flow upwards towards the cathode 1407 in the region between channels 1415. The depletion regions of the vertical channels 1415 are pushed together, creating a large potential drop for the holes to travel. This large potential drop results in an increase in the hole concentration in the drift region, which reduces the on-state losses for the device structures 1400, 1450, and 1451.

Although FIGS. 18 and 19 and the above description apply to a N type IGBT, a similar configuration may be achieved for a P type IGBT by reversing the polarities of the dopants.

Figure 20:
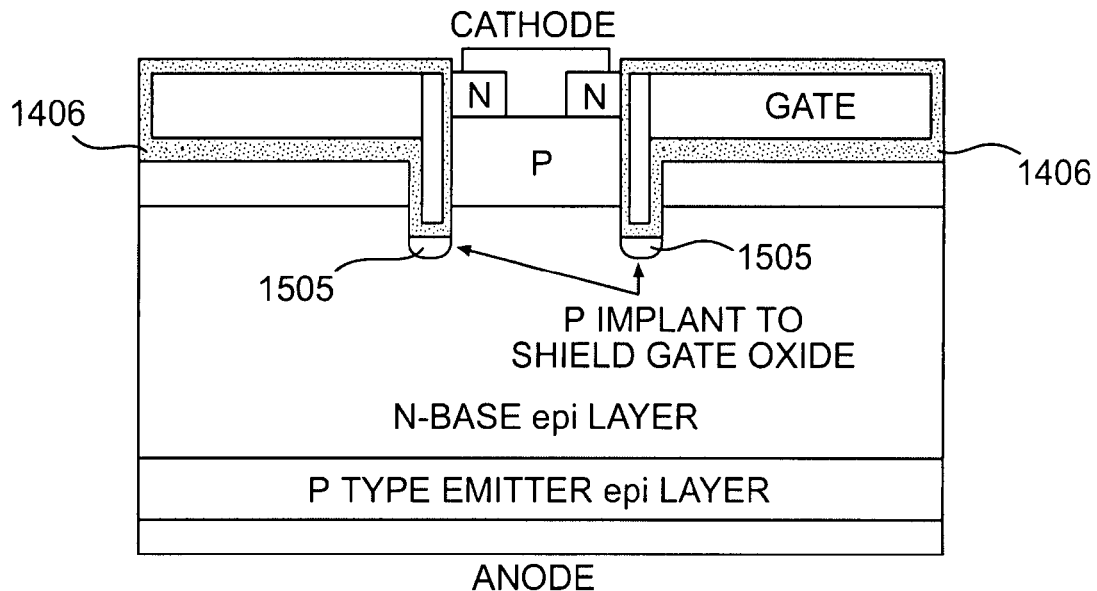
FIG. 20 illustrates a non-punch through trench gate IGBT with a P implant, in accordance with an embodiment.
Figure 21:
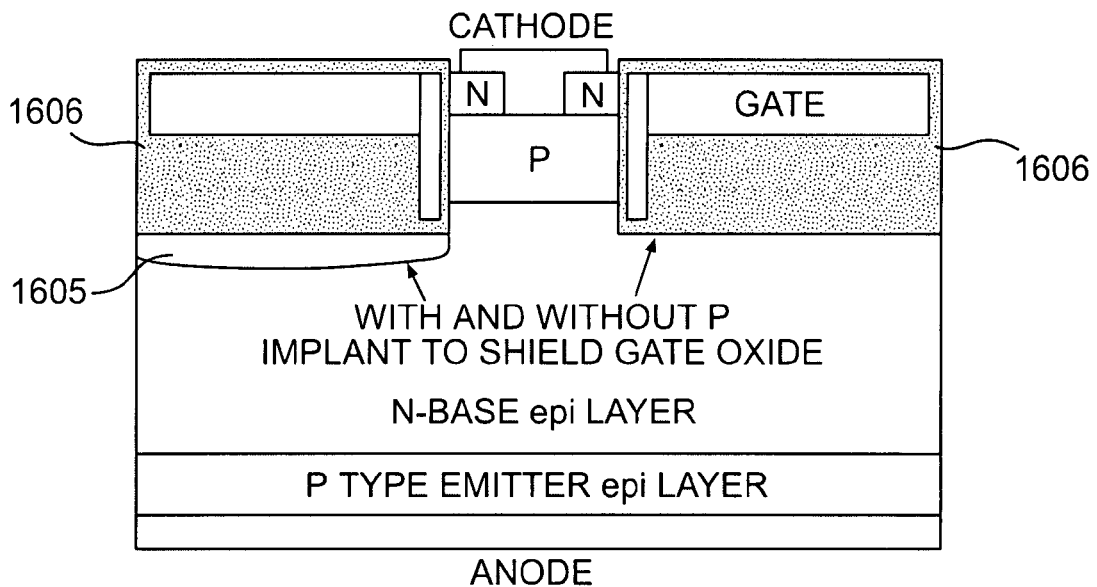
FIG. 21 illustrates a non-punch through trench gate IGBT with a P implant, in accordance with an embodiment.

FIG. 20 illustrates a non-punch through trench gate IGBT, as shown in FIG. 19, with P implants 1505 to shield the gate oxide 1406. FIG. 20 illustrates a non-punch through trench gate IGBT, as shown in FIG. 19, with P implant 1605 to shield the gate oxide 1606. FIG. 21 shows the shield oxide 1606 with and without the P implants. Under reverse bias stress, the gate oxide 1406 can see significant electric fields. In order to prevent the gate oxide from experiencing high electric fields, the P implants, such as implants 1505 and 1605 can be placed at high electric field points, thus reducing the electric fields in the oxide.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. An integrated semiconductor device comprising:
    a first Vertical Junction Field Effect Transistor (VJFET) having a source, and a pair of gates disposed on each side of the first VJFET source;
    a second VJFET transistor having a source, and a pair of gates disposed on each side of the second VJFET source, wherein at least one gate of the first VJFET is separated from at least one gate of the second VJFET by a channel;
    a Junction Barrier Schottky (JBS) diode positioned between the first and second VJFETs, wherein the JBS diode comprises a metal contact that forms a rectifying contact between the JBS diode and the channel and a non-rectifying contact between the JBS diode and at least one gate of the first and second VJFETs, and wherein the metal contact is an anode of the JBS diode;
    a first electrical connection, wherein the first electrical connection ties the gates of the first VJFET, the gates of the second VJFET, and the anode of the JBS diode to a common gate electrode; and
    a second electrical connection, wherein the second electrical connection ties the source of the first VJFET and the source of the second VJFET to a common source electrode.

2. The device of claim 1, wherein at least one of the first and second VJFETs is a normally-off VJFET.

3. The device of claim 1, wherein the source and the channel comprise a P-type semiconductor material and the gates comprise a N-type semiconductor material.

4. The device of claim 1, wherein the source and the channel comprise a N-type semiconductor material and the gates comprise a P-type semiconductor material.

5. The device of claim 1, wherein the gates of the first and second VJFETs comprise ion regions implanted into the channel.

6. The device of claim 1, wherein the gates of the first and second VJFETs comprise ion regions diffused into the channel.

7. The device of claim 1, wherein the gates of the first and second VJFETs comprise ion regions formed by epitaxial regrowth.

8. The device of claim 1, wherein a Schottky metal directly contacts both the channel and the gate region.

9. The device of claim 1, wherein the gates of the first and second VJFETs comprise a planar structure.

10. The device of claim 1, wherein the gates of the first and second VJFETs are formed by a buried gate technique.

* * * * *